United States Patent
Leung et al.

(10) Patent No.: US 6,795,364 B1
(45) Date of Patent: Sep. 21, 2004

(54) METHOD AND APPARATUS FOR LENGTHENING THE DATA-RETENTION TIME OF A DRAM DEVICE IN STANDBY MODE

(75) Inventors: Wingyu Leung, Cupertino, CA (US); Jae-Hong Jeong, San Jose, CA (US)

(73) Assignee: Monolithic System Technology, Inc., Sunnyvale, CA (US)

( * ) Notice: Subject to any disclaimer, the term of this patent is extended or adjusted under 35 U.S.C. 154(b) by 30 days.

(21) Appl. No.: 10/377,677

(22) Filed: Feb. 28, 2003

(51) Int. Cl.[7] .................................................. G11C 7/00
(52) U.S. Cl. ........................................ 365/222; 365/201
(58) Field of Search ............................... 365/200, 201, 365/149, 230.06

(56) References Cited

U.S. PATENT DOCUMENTS

| | | |
|---|---|---|
| 4,330,852 A | 5/1982 | Redwine et al. |
| 4,549,284 A | 10/1985 | Ikuzaki |
| 4,625,301 A | 11/1986 | Berger |
| 4,839,867 A | 6/1989 | Poehnitzsch |
| 4,999,814 A | 3/1991 | Hashimoto |
| 5,033,027 A | 7/1991 | Amin |
| 5,193,072 A | 3/1993 | Frenkil et al. |
| 5,295,109 A | 3/1994 | Nawaki |
| 5,450,364 A | 9/1995 | Stephens, Jr. et al. |
| 5,471,601 A | 11/1995 | Gonzales |
| 5,511,033 A | 4/1996 | Jung |
| 5,544,120 A | 8/1996 | Kuwagata et al. |
| 5,559,750 A | 9/1996 | Dosaka et al. |

(List continued on next page.)

FOREIGN PATENT DOCUMENTS

| | | |
|---|---|---|
| EP | 0 811 979 A2 | 9/1991 |
| EP | 0 588 250 A2 | 9/1993 |
| EP | 0 794 497 A2 | 3/1997 |
| EP | 942430 | 9/1999 |
| GB | 2265035 | 9/1993 |
| JP | 58048293 | 10/1983 |
| JP | 98-19309 | 5/1998 |
| WO | WO 99-22894? | 10/1999 |

OTHER PUBLICATIONS

Ayukawa, Kazushige, IEEE Journal of Solid–State Circuits, "An Access–Sequence Control Scheme . . . ," vol. 33 (No. 5) May 12, 1998.

(List continued on next page.)

*Primary Examiner*—Anh Phung
(74) *Attorney, Agent, or Firm*—Bever, Hoffman & Harms, LLP; E. Eric Hoffman

(57) ABSTRACT

An array of memory cells that require periodic refresh is operated in a single-cell mode during normal operating conditions. Upon receiving an asserted standby control signal from an accessing memory client, the array enters a standby mode from the normal operating conditions. The standby mode can be specified as a differential-cell mode, a single-cell mode or a non-retentive mode. To enter the differential-cell standby mode, data stored in the single-cell mode is converted to a differential-cell mode. In this conversion, half of the data stored in the single-cell mode is saved, while the other half is discarded. In the differential-cell standby mode, refresh operations are performed less frequently than in the normal operating mode, thereby conserving power. The external clock signal provided by the accessing memory client can be disabled during the differential-cell standby mode, as a local clock signal is provided to implement the refresh operations during standby mode.

28 Claims, 10 Drawing Sheets

U.S. PATENT DOCUMENTS

| | | | |
|---|---|---|---|
| 5,583,823 A | | 12/1996 | Park |
| 5,586,287 A | | 12/1996 | Okumura et al. |
| 5,642,320 A | | 6/1997 | Jang |
| 5,659,515 A | | 8/1997 | Matsuo et al. |
| 5,721,862 A | | 2/1998 | Sartore et al. |
| 5,748,547 A | | 5/1998 | Shau |
| 5,784,705 A | | 7/1998 | Leung |
| 5,802,555 A | | 9/1998 | Shigeeda |
| 5,822,265 A | | 10/1998 | Zdenek |
| 5,828,619 A | * | 10/1998 | Hirano et al. ............... 365/222 |
| 5,829,026 A | | 10/1998 | Leung et al. |
| 5,835,401 A | | 11/1998 | Green et al. |
| 5,859,809 A | | 1/1999 | Kim |
| 5,873,114 A | | 2/1999 | Rahman et al. |
| 5,875,452 A | | 2/1999 | Katayama et al. |
| 5,940,851 A | | 8/1999 | Leung |
| 5,999,474 A | | 12/1999 | Leung et al. |
| 6,028,804 A | | 2/2000 | Leung |
| 6,075,740 A | | 6/2000 | Leung |
| 6,195,303 B1 | | 2/2001 | Zheng |
| 6,222,785 B1 | | 4/2001 | Leung |
| 6,246,619 B1 | * | 6/2001 | Ematrudo et al. .......... 365/201 |
| 6,259,651 B1 | | 7/2001 | Leung |
| 6,282,606 B1 | | 8/2001 | Holland |
| 6,366,989 B1 | | 4/2002 | Keskar et al. |
| 6,449,203 B1 | * | 9/2002 | Cowles et al. .............. 365/222 |
| 6,496,437 B2 | | 12/2002 | Leung |
| 6,504,780 B2 | | 1/2003 | Leung |

OTHER PUBLICATIONS

Enhanced Memory Systems, Inc., A 16Mbit Enhanced SDRAM Family . . . , 1997.

MoSys, Inc., MD904 To MD920 , . . . ; 1996; DS01–2.4–Feb. 21, 1997.

Toshiba MOS Digital Integrated Circuit; Sep. 2, 1996.

IBM Corp., A 16Mbit Synchronous DRAM, Revised 5/96, pp. 1–100.

Rambus Inc., Direct Rambus Technology Disclosure, 1997, pp. 1–48.

Ramtron International Corp., DM2202/2212 EDRAM 1 Mbx4 Enhanced . . . , pp. 2–17 to 2–33.

NEC Electronics, Inc., Dynamic CMOS Ram, pp. 6–101 to 6–113.

Intel Corp., Pentium Processor 3.3V Pipelined BSRAM Specification, Ver. 2.0, May 25, 1995.

SLDRAM Consortium, "400 Mb/s/pin SLDRAM," pp. 1–59.

Johns, David A. & Martin, Ken, *Analog Integrated Circuit Design*, John Wiley & Sons Inc., 1997, Chap. 5, pp. 248–250.

Infineon Technologies, HYB/E 25L128160AC, 128–Mbit Mobile–RAM; Dec. 2001.

Infineon Technologies, Mobile RAM; Application Note, V1.1, Feb. 2002, pp. 1–7.

* cited by examiner

US 6,795,364 B1

METHOD AND APPARATUS FOR LENGTHENING THE DATA-RETENTION TIME OF A DRAM DEVICE IN STANDBY MODE

RELATED APPLICATIONS

The present application is related to U.S. Pat. No. 6,028,804, by Wingyu Leung, entitled "Method and Apparatus for 1-T SRAM Compatible Memory", and U.S. Pat. Pat. No. 5,999,474 by Wingyu Leung and Fu-Chieh Hsu, entitled "Method and Apparatus for Complete Hiding of the Refresh of a Semiconductor Memory". The present application is also related to U.S. patent application Ser. No. 10/109,878, "RAM Having Dynamically Switchable Access Modes", by Wiodek Kurjanowicz, Jacek Wiatrowski, Dariusz Kowalczyk and Greg Popoff. These patent applications are hereby incorporated by reference in their entirety.

FIELD OF THE INVENTION

The present invention is applicable to semiconductor memories, especially dynamic random access memory (DRAM). In particular, the present invention relates to a method and apparatus for controlling refresh operations in a semiconductor memory such that the data retention time in standby mode is made'significantly longer than the data retention time in a normal operating mode.

RELATED ART

Due to charge leakage, data stored in a DRAM cell must be refreshed periodically. The time elapsed from the time that data is written to a DRAM cell to the time that the data is on the threshold of being corrupted due to charge leakage is referred to as the data retention time of the memory. The longer the data retention time, the less frequently the memory cell needs to be refreshed. Each refresh operation in a DRAM device consumes power. Therefore the longer the data retention time, the lower the required refresh power.

Refresh (or data retention) power is required even when the memory is not being accessed (i.e., when the memory is in a standby mode). Standby mode is defined as a mode in which the memory is not accessed, and some or all of the data stored in the memory is retained. In a power critical application, such as a cell phone, the majority of the power required in standby mode is consumed by performing refresh operations for the DRAM memory. In such an application, it is important to keep the refresh power as low as possible.

A traditional DRAM cell consists of one transistor and one capacitor. Data is stored in a cell in the form of charges in the capacitor. In general, one DRAM cell can store one bit of binary data.

FIG. 1 is a circuit diagram of a traditional DRAM array 100, in which a plurality of DRAM cells are arranged in rows and columns. DRAM array 100 includes word lines WL0–WL8 and bit lines $BL_I$, $BL_{I\#}$, $BL_{I+1}$ and $BL_{I+1\#}$. DRAM array 100 also includes 18 DRAM cells, including DRAM cells 101–104. Each of the DRAM cells includes a capacitor element (represented by a large open square), and an access transistor, which couples the capacitor element to a bit line. The connections between the bit lines and the access transistor drain regions are shown as boxes containing an "X". For example, DRAM memory cell 101 includes capacitor element 111 and access transistor 112.

Within array 100, a column includes a bit-line pair and the associated memory cells. Thus, bit lines $BL_I$ and $BL_{I\#}$ and the DRAM cells coupled to these bit lines form one column of array 100. Bit lines $BL_{I+1}$ and $BL_{I+1\#}$ and the DRAM cells coupled to these bit lines form another column of array 100. Each memory cell is only coupled to one of the two bit lines in the column. A row consists one cell from each column. Thus, the first row consists of DRAM cells 102 and 104 (which are controlled by word line WL0), and the second row consists of the DRAM cells 101 and 103 (which are controlled by word line WL1). The configuration of memory array 100 is a well-known folded bit-line architecture.

To perform a memory access, all of the bit lines $BL_I$, $BL_{I\#}$, $BL_{I+1}$ and $BL_{I+1\#}$ are pre-charged to a fixed voltage. For example, the bit lines can be charged to a voltage equal to half of a supply voltage ($V_{DD}/2$). One of word lines WL0–WL8 is then turned on, thereby connecting one DRAM cell from each column to one of the two bit lines in the column. For example, word line WL1 can be turned on, thereby coupling DRAM cell 101 to bit line $BL_I$ (and DRAM cell 103 to bit line $BL_{I+1}$). The charge stored in charge storage element 111 of DRAM cell 101 is shared with bit line $BL_I$, and thereby alters the voltage on this bit line. However, the complimentary bit line $BL_{I\#}$ of the same column remains floating, such that the voltage on this complementary bit line is not directly changed by any DRAM cell charge. Each bit line pair is connected to a sense amplifier, which amplifies the signal difference between the complimentary bit lines. The amplified signals in the bit-line pairs are multiplexed to the data lines through column switches. The difference in the voltage ($\Delta V$) between the complimentary bit lines, before the sense amplifier is turned on, has to overcome any offset in the sense amplifier and any noise that may exist during sensing in order for the data to be sensed accurately. The voltage difference $\Delta V$ is dependent mainly on the charge stored in the capacitor element. This charge leaks over time. The longer the refresh period, the greater the charge leakage, and the smaller the voltage difference $\Delta V$. The above-described operating mode of DRAM array is commonly referred to as single-cell mode.

The traditional DRAM array 100 shown in FIG. 1 can also operate in a differential-cell mode. In the differential-cell mode, two memory cells attached to different bit lines in a column are used to store one bit of binary data. For example, DRAM cell 101 and DRAM cell 102 can be used to store one bit of data in the first column of array 100. Data is written to a column by pulling one of the column bit lines (e.g., $BL_I$) to the $V_{DD}$ supply voltage, and the other one of the column bit lines (e.g., $BL_{I\#}$) to the ground supply voltage. Therefore, in the differential-cell mode, one DRAM cell (e.g., DRAM cell 101) stores a voltage of $V_{DD}$ in the associated capacitor element, and the other DRAM cell (e.g., DRAM cell 102) stores a ground voltage in the associated capacitor element. A differential DRAM cell therefore contains two single DRAM cells that store complementary data. During sensing, word lines connected to both DRAM cells (e.g., WL0 and WL1) are turned on, thereby connecting the cells to the complimentary bit lines. Since the DRAM cells are identically constructed, the coupling between the word lines and the bits lines are equal. As a result, any word line to bit-line coupling noise is cancelled during the differential sensing. Likewise, other coupling noise, such as noise in an N-well in which the DRAM cells are contained, is cancelled. More importantly, the differential signal developed across the complementary bit lines is two times larger than the signal developed across the bit lines during the single-cell mode. As a result, the signal strength of a differential DRAM cell is much stronger and thereby can retain the data much longer. It has been shown that the data retention time in differential-cell mode is greater than the data retention time in single-cell mode by a factor of more than 50. (See, U.S. patent application Ser. No. 10/109,878, by Kurjanowicz et al.)

In power critical applications, such as wireless phones and personal data assistants (PDAs), where the devices operate most of the time in the standby mode, the standby power is critical. For devices that include a DRAM array, the standby power is consumed mainly by refresh operations. It is therefore desirable for the DRAM array to have a long data retention time, such that relatively few refresh operations are required during a given time period. When DRAM array 100 operates in the differential-cell mode, the refresh power is significantly less (>25 times less) than the refresh power in single-cell mode. That is, even though the power consumed during a refresh operation in the differential-cell mode is relatively high (because two word lines must be turned on for each refresh operation), the overall refresh power is reduced because the number of refresh operations performed in a given period of time is reduced by a factor of greater than 50. Note that in the differential-cell mode, the storage capacity of the DRAM array is reduced by half (because two DRAM cells are used to store one bit of binary data).

U.S. patent application Ser. No. 10/109,878, by Kurjanowicz et al., and U.S. Pat. No. 5,712,823, by Gillingham describe DRAM memory devices that can be operated in either single-cell mode or differential-cell mode. These DRAM memory devices, as a whole or in parts, can be selectively programmed to operate in differential-cell mode or single-cell mode. However, these DRAM devices do not provide means for switching from differential-cell mode to single-cell mode without losing some of the data, as the refresh time and signal levels of the two operating modes are quite different. Likewise, these DRAM devices do not provide means for switching from single-cell mode to differential-cell mode with the data in half of the cells preserved.

It would therefore be desirable to have a memory device that can operate in single-cell mode during normal operation and in differential-cell mode during standby operation. It would further be desirable if up to half of the stored data during normal operation could be preserved when switching from normal operation to standby operation. It would further be desirable if all of the data stored during standby operation could be preserved when switching from standby operation to normal operation.

SUMMARY

Accordingly, the present invention provides an array of DRAM cells that are operated in a single-cell mode during normal operating conditions. Upon receiving an asserted standby control signal from an accessing memory client, the array enters a standby mode from the normal operating conditions. The standby mode can be specified as a differential-cell mode, a single-cell mode or a non-retentive mode. To enter the differential-cell standby mode, data stored in the single-cell mode is converted to a differential-cell mode. In this conversion, half of the data stored in the single-cell mode is saved, while the other half is discarded. In the differential-cell standby mode, refresh operations are performed less frequently than in the normal operating mode, thereby conserving power. The external clock signal provided by the accessing memory client can be disabled during the standby mode, as a local clock signal is provided to generate the memory access signals during the standby mode.

In accordance with one embodiment, the conversion from single-cell mode to differential-cell mode is performed as follows. During normal single-cell operation, refresh operations are performed periodically in response to a first refresh enable signal. A standby control signal is asserted, thereby indicating that the standby mode should be entered. The next time the first refresh enable signal is activated, the asserted standby control signal is latched, and a special burst refresh operation is performed.

The special burst refresh operation is implemented as follows. First, an even word line is turned on in accordance with a single-cell read operation. After the data values stored in the memory cells associated with the even word line have developed an adequate signal strength on the bit lines, the sense amplifiers are turned on. The sense amplifiers cause the data signals on the bit lines exhibit a full signal swing. At this time, a corresponding adjacent odd word line is turned on. As a result, the data values stored in single-cell mode DRAM cells associated with the even word line are translated into data values stored in differential-cell mode DRAM cells associated with the even word line and the corresponding odd word line.

During the special burst refresh operation, this process is repeated for all of the rows in the memory array, such that half of the data values stored in the single-cell mode DRAM cells are stored in differential-cell mode DRAM cells, and the other half of the data values stored in the single-cell mode DRAM cells are discarded.

After the special burst refresh operation is complete, the latched standby control signal is stored as a differential-cell mode indicator signal. This differential-cell mode indicator signal causes a second refresh enable signal, having a period much larger than the period of the first refresh enable signal, to control the refresh operations during the differential-cell standby mode. In one embodiment, the period of the second refresh enable signal is about 40 times longer than the period of the first refresh enable signal. In accordance with another embodiment, the periods of the first and second refresh enable signals are automatically adjusted with respect to temperature.

In accordance with another embodiment, the memory array is operated using a clock division scheme, wherein during normal operating conditions, accesses to the memory array are performed while the system clock signal has a first logic state, and refresh operations to the memory array are performed while the system clock signal has a second logic state.

In accordance with yet another embodiment, a plurality of memory blocks that require periodic refresh operate in a single-cell mode during normal operating conditions. Each of these memory blocks can enter a standby mode from the normal operating conditions. A first set of the memory blocks is controlled to operate in first standby mode (e.g., differential-cell mode, single-cell mode or non-retentive mode). A second set of the memory blocks is controlled to operate in a second standby mode, different than the first standby mode. This embodiment advantageously provides flexibility in implementing various standby modes for different memory blocks.

The present invention will be more fully understood in view of the following description and drawings.

DETAILED DESCRIPTION

Figure 1:
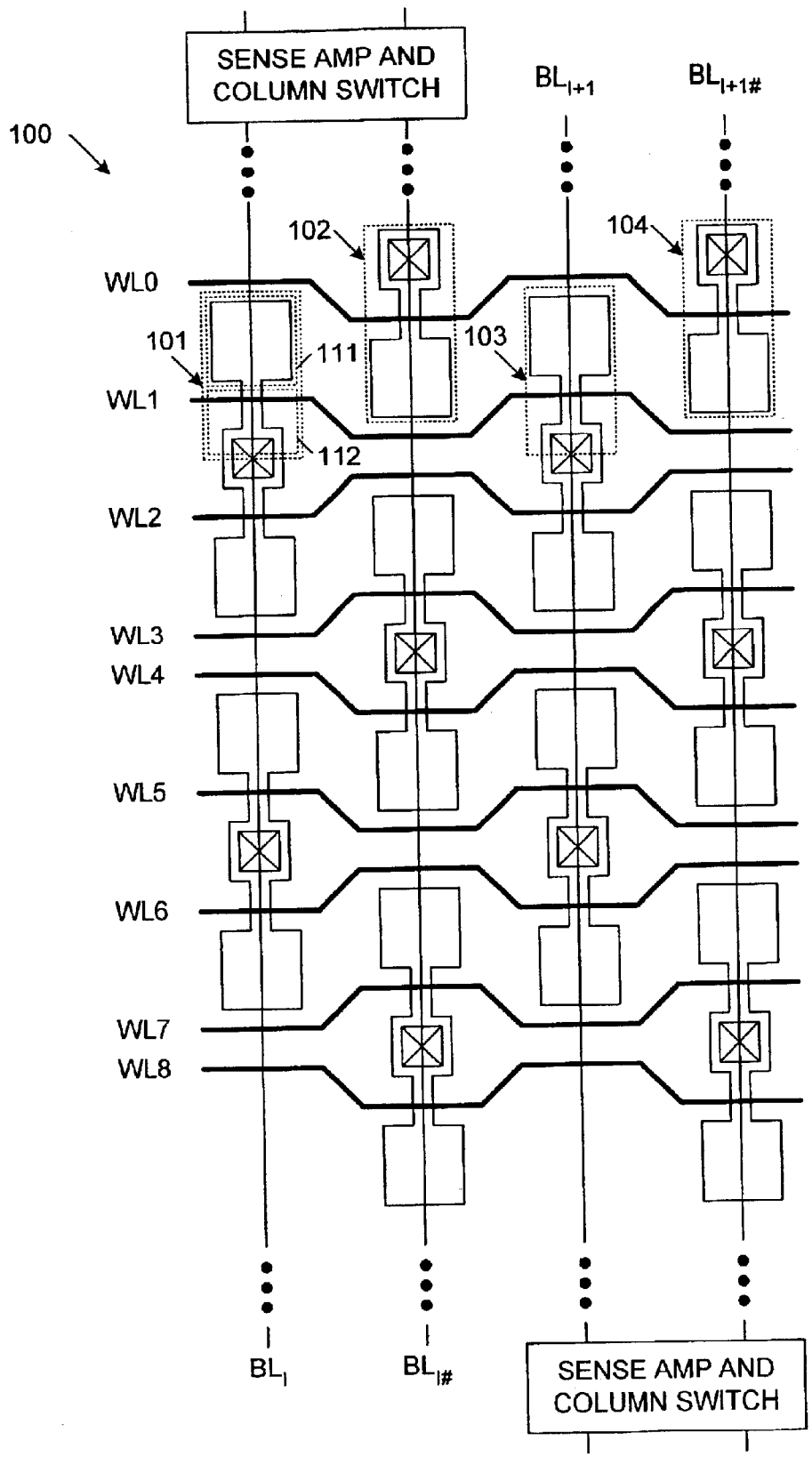
FIG. 1 is a circuit diagram of a conventional DRAM array, which can be operated in either a single-cell mode or a differential-cell mode.

The present invention provides a memory device or an embedded memory block that includes a plurality of memory cells that must be periodically refreshed in order to retain data values, and a control circuit for accessing and refreshing the memory cells. In the described examples, these memory cells are dynamic random access memory (DRAM) cells. The DRAM cells are arranged in a plurality of memory banks. Multiple banks are grouped together to form a memory block. Each memory block has its own set of control signals for handling read, write and refresh operations. An accessing memory device provides an external standby control signal (ZZ#). When the standby control signal ZZ# is asserted low, the memory macro leaves the normal operating mode and enters a standby mode. When the standby control signal ZZ# is de-asserted high, the memory device exits the standby mode and re-enters the normal operating mode. A pair of static signals REFSEL[1:0] are provided to select different refresh schemes in the standby mode. The refresh select signals REFSEL[1:0] can be provided by a register, which can be set or reset any time before the memory macro enters the standby mode.

In normal operating mode, the memory banks are operated in the single-cell mode. During normal operating mode, the accessing and refreshing of the memory cells is controlled such that the refreshing of the memory cells does not interfere with any external access of the memory cells.

The refresh select signals REFSEL[1:0] determine the manner in which the memory block operates during the standby mode. Thus, when the standby control signal ZZ# is asserted, the refresh mode is determined by the refresh select signals REFSEL[1:0]. More specifically, the refresh select signals REFSEL[1:0] select one of three standby modes: (1) a non-retentive standby mode, (2) a differential-cell mode, or (3) a single-cell mode.

In the non-retentive standby mode, the memory banks stop performing self-refresh operations, and the data stored in the DRAM cells is eventually lost.

In the differential-cell standby mode, the operation of the memory banks is converted from the single-cell mode to the differential-cell mode, with half of the data values stored in the single-cell mode being preserved in the differential-cell mode. Standby refresh operations are then performed in the differential-cell mode. In the transition from normal operating mode to differential-cell standby mode, half of the data values stored in the single-cell DRAM cells are discarded, and the other half of the data is retained in differential DRAM cells. That is, the number of rows in each memory bank is reduced by half, as DRAM cells associated with two neighboring word lines are combined to form differential DRAM cells.

In the single-cell standby mode, operation remains unchanged from the normal-operating mode (although only refresh operations are performed during the single-cell standby mode).

In an alternative embodiment, the memory macro can contain two or more memory blocks. In this embodiment, each of the memory blocks has a separate sets of refresh control signals REFSEL[1:0], so that the standby mode of each memory block can be selected independently.

Figure 2:
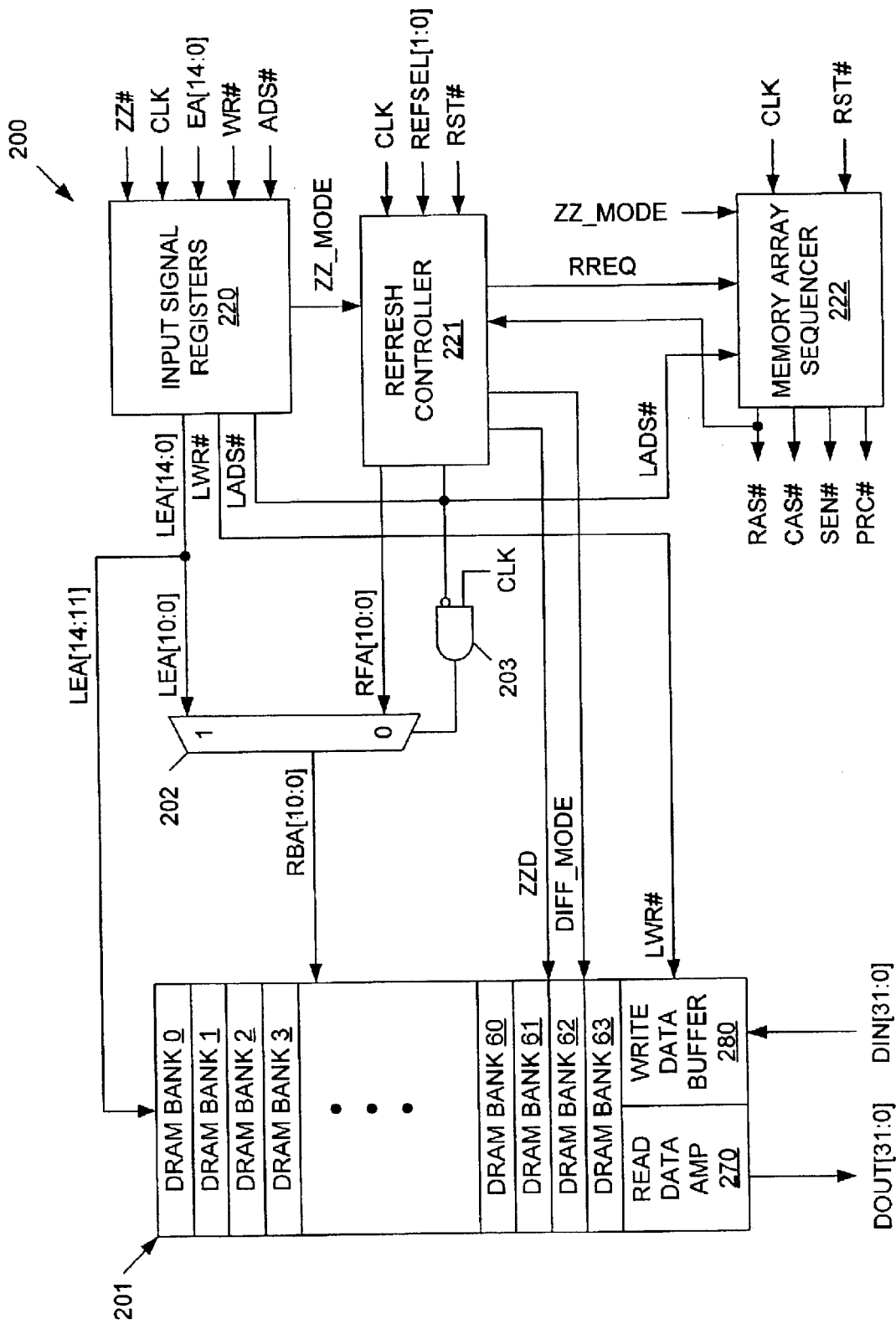
FIG. 2 is a block diagram of a memory block in accordance with one embodiment of the present invention.

FIG. 2 is a block diagram of a memory block 200 in accordance with one embodiment of the present invention. Memory block 200 can be referred to as a 1-T SRAM block, because this memory block uses 1-transistor (1-T) DRAM cells, yet during normal operation, can be accessed in the same manner as a static random access memory (SRAM) system, because the refresh operations are hidden. For example, memory accesses can be performed when a system clock signal CLK has a logic high state, and refresh operations can be performed when the system clock signal CLK has a logic low state. Such an accessing scheme is described in U.S. Pat. No. 6,504,780 by Wingyu Leung, entitled "Method and Apparatus for Completely Hiding Refresh Operations in a DRAM Device Using Clock Division", which is hereby incorporated by reference.

Memory block 200 includes DRAM array 201, 2-to-1 multiplexer 202, AND gate 203, input signal registers 220, refresh controller 221 and memory array sequencer 222. DRAM array 201 includes 64 DRAM memory banks 0–63, read data amplifier 270 and write data buffer 280. Each of DRAM-banks 0–63 includes 32 rows and 512 columns of DRAM memory cells, as well as the associated address decoders, word line drivers, sense-amplifiers and column multiplexers, which are not shown, but are understood by those of ordinary skill in the art. The column multiplexers of DRAM memory banks 0–63 are connected in parallel to read data amplifiers 270 and write data buffer 280. Each of DRAM banks 0–63 is capable of storing 512 32-bit words. The total capacity of DRAM memory banks 0–63 is therefore 32 K×32-bit words.

The external interface of memory block 200 includes a 32-bit input data bus for providing an input data word DIN[31:0 ] to write data buffer 280, a 32-bit output data bus for providing an output data word DOUT[31:0] from read data amplifier 270, a write/read indicator line for receiving write/read indicator signal WR#, a clock input terminal for receiving an external clock signal CLK, a 14-bit address bus for receiving-external address bits EA[14:0], an address strobe line for receiving an address strobe signal ADS#, a reset line for receiving a reset signal RST#, a control signal line for receiving a standby mode signal ZZ#, and a control signal bus for receiving refresh select signals REFSEL[1:0]. As used herein, the # symbol indicates that a signal is active low.

All of the external signals are referenced to the rising edge of the CLK signal. The external address signal EA[14:0] is divided into 3 fields: a 4-bit word (column) address EA[14:11] (which identifies one of the sixteen 32-bit words in a row), a 6-bit bank address EA[10:5] (which identifies one of the 64 memory banks 0–63), and a 5-bit row address EA[4:0] (which identifies one of the 32 rows in a memory bank).

An external device initiates an access to memory block 200 by asserting a logic low address strobe signal ADS#, driving the write/read indicator signal WR# to the desired state (high for write and low for read), and providing an external address EA[14:0]. The external device initiates a standby mode in memory block 200 by asserting the standby signal ZZ# low. The ADS#, WR#, ZZ# and EA[14:0] signals are all registered (i.e., latched) into input signal registers 220 at the rising edge of CLK signal. Input signal registers 220 provide the latched ADS#, WR#, ZZ# and EA[14:0] signals as latched output signals LADS#, LWR#, ZZ_MODE and LEA[14:0], respectively. The latched external address LEA [14:0] is divided into two groups of address signals. Address signal LEA[14:11] contains the column address of the memory cells selected for the external access, and address signal LEA[10:0] contains the row and bank address of the memory cells selected for the external access. Address signal LEA[14:11] is provided to the column decoder circuitry in each of DRAM banks 0–63. Address signal LEA[10:0] is provided to an input bus of 2-to-1 multiplexer 202.

The latched address strobe signal LADS# is provided to refresh controller 221, memory array sequencer 222 and to an inverting input terminal of AND gate 203. The latched write/read indicator signal LWR# is provided to read data amplifier 270 and write data buffer 280. The latched ZZ_MODE signal is provided to refresh controller 221 and memory array sequencer 222.

Refresh accesses to DRAM array 201 are managed by refresh controller 221. Refresh controller 221 initiates refresh operations by periodically activating a refresh request signal RREQ. Refresh controller 221 also provides an 11-bit refresh address RFA[10:0], which identifies the bank and row to be refreshed in DRAM array 201. The refresh address RFA[10:0] is incremented each time the refresh request signal RREQ is activated. As described in more detail below, refresh controller 221 also generates the differential mode control signals DIFF_MODE and ZZD in response to the ZZ_MODE and REFSEL[1:0] signals.

Memory array sequencer 222 generates the conventional DRAM control signals RAS# (row access), SEN# (sense amplifier enable), CAS# (column access), and PRC# (precharge) for controlling the operations of memory array 201. The functionality of the RAS#, SEN#, CASE and PRC# control signals in accessing a DRAM array is understood by those of ordinary skill in the art. For example, the functionality of these control signals is described in detail in U.S. Pat. No. 6,078,547, by Wingyu Leung, entitled "Method and Structure for Controlling Operation of a DRAM Array", which is hereby incorporated by reference.

During normal operation, all the cells in DRAM array 201 operate in the single-cell mode. This single-cell mode is described in more detail in U.S. Pat. No. 6,504,780. In general, during normal operation, memory accesses are performed while the external clock signal CLK has a first logic state (e.g., a logic high state), and any required refresh operations are performed while the external clock signal CLK has a second logic state (e.g., a logic low state). In accordance with the present invention, memory block 200 incorporates a standby mode to save power when DRAM array 201 is not being accessed. As described in more detail below, the standby mode is controlled by the standby control signal ZZ# and the refresh control signals REFSEL[1:0].

Figure 3:
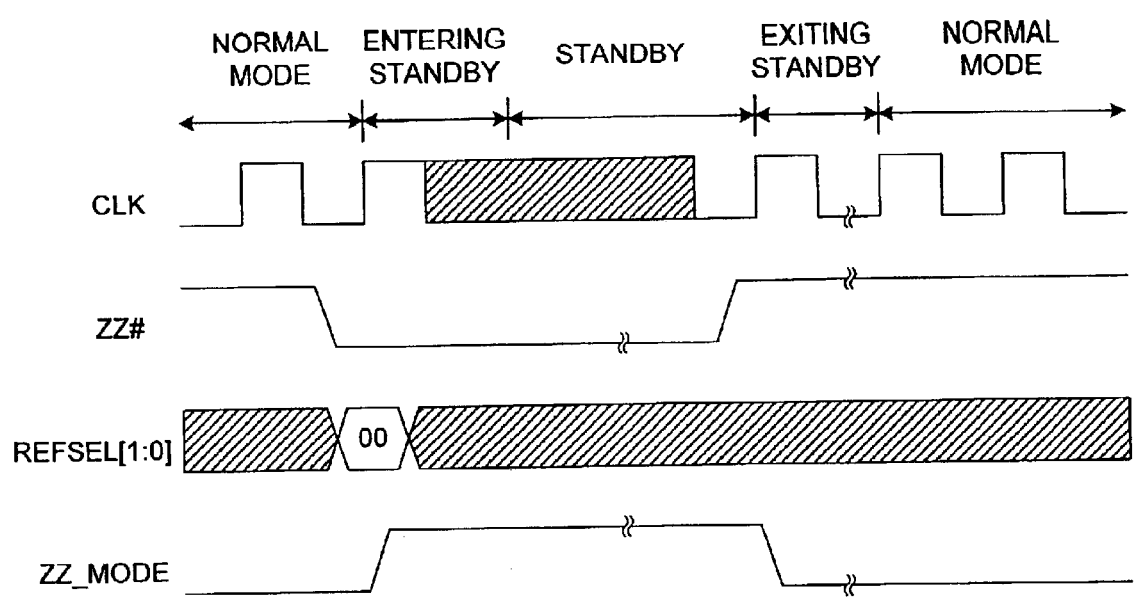
FIG. 3 is a waveform diagram illustrating the general timing of various control signals of the memory block of FIG. 2 while entering and exiting a standby mode, in accordance with one embodiment of the present invention.

FIG. 3 is a waveform diagram illustrating the general timing of the standby control signal ZZ#, the latched standby control signal ZZ_MODE, the refresh select signals REFSEL[1:0] and the CLK signal when the memory macro is entering and exiting the standby mode.

When the standby control signal ZZ# is de-asserted high, memory block 200 operates in normal (single-cell) operating mode. In the normal mode, the external-clock signal CLK runs continuously. The standby control signal ZZ# is activated low to initiate a standby mode. The low standby control signal ZZ# is latched at the rising edge of the CLK signal, thereby providing a logic high latched standby signal ZZ_MODE. Note that an inverter (or the equivalent) is necessary to provide a logic high zz_MODE signal in response to the logic low standby control signal zz#.

Memory block 200 then enters a standby mode in response to the logic high ZZ_MODE signal, in accordance with the value of the refresh select signals REFSEL[1:0]. After entering the standby mode, the external clock signal CLK can be stopped by the accessing memory device (irrespective of the selected refresh mode), in order to save power. At this time, an internally generated clock signal can be used to fulfill the necessary refresh timing requirements.

When the standby control signal ZZ# is deactivated high, and the external clock signal CLK has been reactivated, memory block 200 is switched back to the normal (single-cell) operating mode. More specifically, the logic high standby control signal ZZ# is latched at the rising edge of the external clock signal CLK, thereby providing a logic low ZZ_MODE signal. Memory block 200 exits the standby mode in response to the logic low ZZ_MODE signal, again in accordance with the value of the refresh select signals REFSEL[1:0].

If the refresh select signals REFSEL[1:0] indicate that the standby mode is a differential-cell standby mode, then the a single-cell to differential-cell conversion is performed when entering the standby mode, and a differential-cell to single-cell conversion is performed when exiting the standby mode. The operation and control of the CLK, ZZ#, REFSEL [1:0] and ZZ_MODE signals will be described in more detail below.

Figure 4:
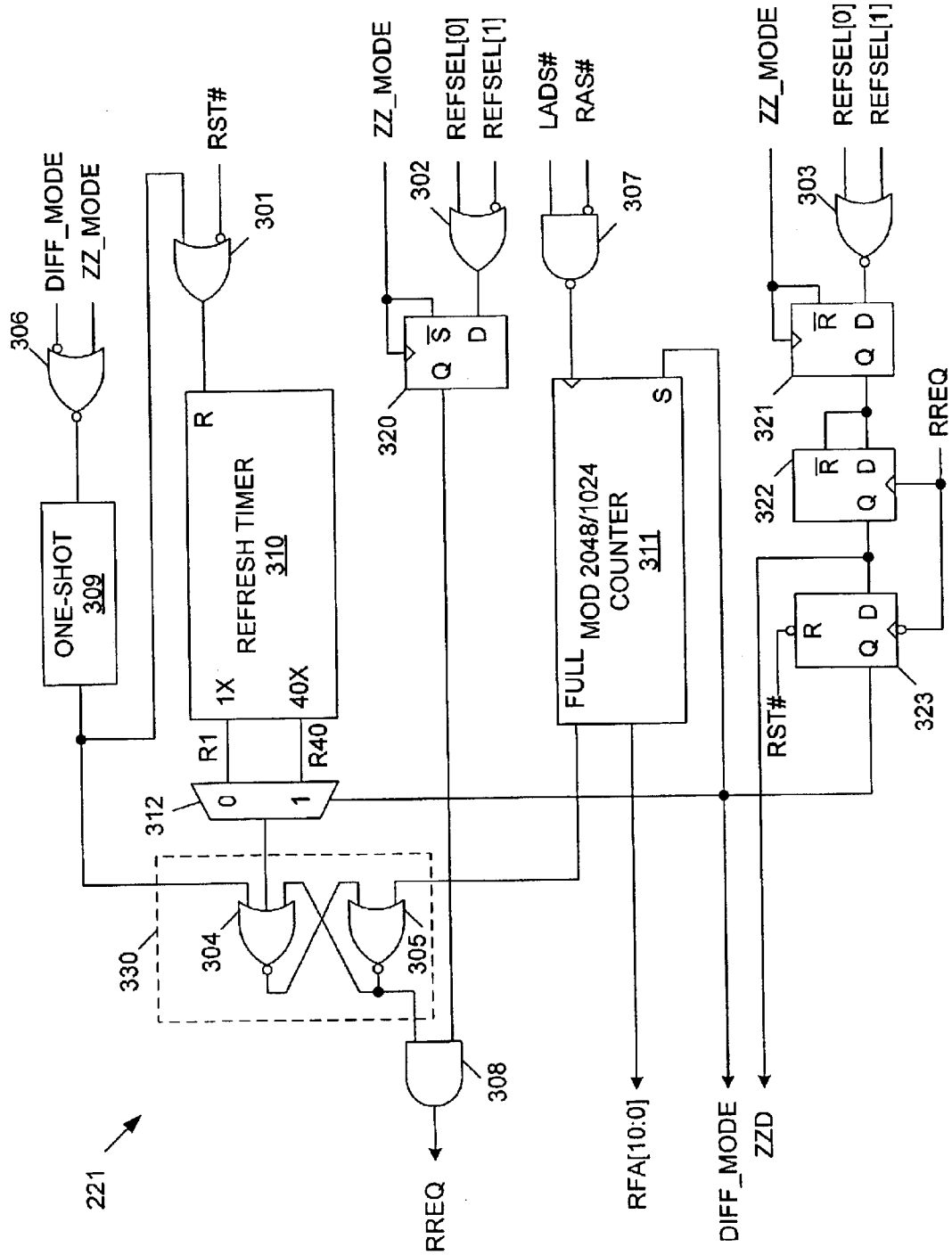
FIG. 4 is a block diagram of a refresh controller present in the memory block of FIG. 2 in accordance with one embodiment of the present invention.

FIG. 4 is a block diagram of refresh controller 221 in accordance with one embodiment of the present invention. Refresh controller 221 includes OR gates 301–302, NOR gates 303–306, NAND gate 307, AND gate 308, one-shot device 309, refresh timer 310, refresh counter 311 and flip-flops 320–323. NOR gates 304–305 are cross-coupled to form flip-flop 330.

Refresh timer 310 periodically generates refresh enable signals R1 and R40 on output terminals 1X and 40X, respectively. Refresh timer 310 includes an oscillator (not shown), which generates the refresh enable signal R1. In one embodiment, this oscillator is a temperature adaptive oscillator similar to the one described in U.S. patent application Ser. No. 10/300,427, "Method and Apparatus For Temperature Adaptive Refresh in 1T-SRAM Compatible Memory Using The Subthreshold Characteristics of MOSFET Transistors". Alternately, this oscillator can be a simple ring oscillator.

Refresh timer 310 also includes a modulo-40 counter (not shown), which has a clock input terminal coupled to receive the refresh enable signal R1. This modulo-40 counter is reset in response to a logic high signal on the output terminal of OR gate 301. OR gate 301 provides a logic high output signal when the system reset signal RST# is asserted low, or when one-shot device 309 provides a logic high output signal. As described in more detail below, one-shot device 309 provides a logic high output signal when exiting a differential-cell standby mode.

Figure 5:
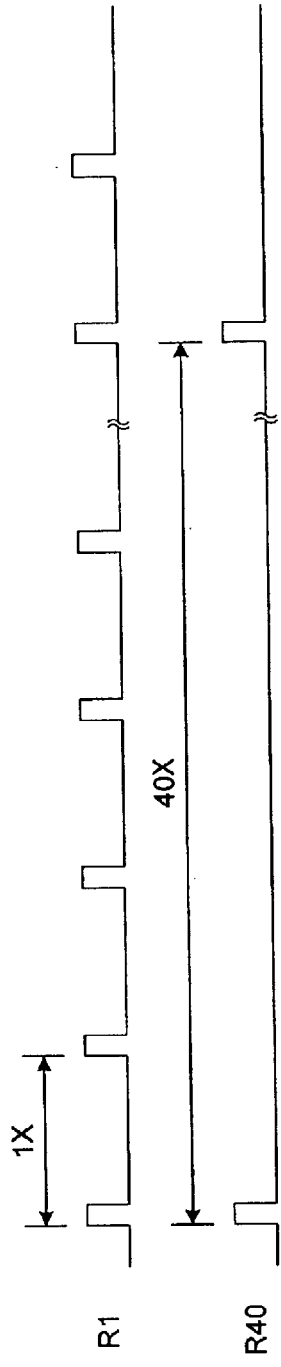
FIG. 5 is a waveform diagram that illustrates refresh enable signals generated by the refresh controller of FIG. 4 in accordance with one embodiment of the present invention.

The modulo-40 counter in refresh timer 310 generates the refresh enable signal R40 in response to the refresh enable signal R1. The refresh enable signal R40 therefore has an oscillation period that is 40 times longer than the oscillation period of the refresh enable signal R1. FIG. 5 is a waveform diagram illustrating refresh enable signals R1 and R40. As described in more detail below, refresh enable signal R1 is used to generate the refresh request signal RREQ when memory block 200 is operating in single-cell mode, and refresh enable signal R40 is used to generate the refresh request signal RREQ when memory block 200 is operating in differential-cell mode. Thus, refresh operations are performed 40 times more often when operating in single-cell mode, as compared with differential-cell mode.

Refresh enable signals R1 and R40 are provided to 2-to-1 multiplexer 312. Multiplexer 312 selectively routes one of these refresh enable signals to flip-flop 330 in response to the DIFF_MODE signal. As described in more detail below, the DIFF_MODE signal has a logic high state when memory block 200 is operating in the differential-cell mode. Thus, when memory block 200 is operating in the differential-cell standby mode, multiplexer 312 routes the refresh enable signal R40 to flip-flop 330. Otherwise, multiplexer 312 routes the refresh enable signal R1 to flip-flop 330.

Flip-flop 330 latches each positive pulse received from multiplexer 312, thereby providing a logic high signal to AND gate 308. As long as memory block 200 is not in a non-retentive standby mode (i.e., as long as the other input terminal of AND gate 308 receives a logic high signal), each positive pulse routed through multiplexer 312 will cause the refresh request signal RREQ to be asserted high. As described in more detail below, a burst refresh operation is performed while the refresh request signal RREQ is asserted high. Thus, burst refresh accesses are performed less frequently (i.e., 40 times less frequently) when memory block is in operating in differential-cell standby mode. As a result, significant power savings exist when operating in differential-cell standby mode.

Refresh controller 221 also includes modulo-2048/1024 counter 311. The modulo value of counter 311 is controlled to be either 2048 or 1024 in response to the DIFF_MODE signal. When memory block 200 is operating in differential-cell standby mode (i.e., the DIFF_MODE signal has a logic high state), modulo-counter 311 is configured to operate as a modulo-1024 counter. Conversely, when memory block 200 is operating in single-cell mode (i.e., the DIFF_MODE signal has a logic low state), modulo-counter 311 is configured to operate as a modulo-2048 counter.

When memory block 200 is operating in differential-cell standby mode, the modulo-1024 counter 311 provides a refresh address RFA[9:0], which is used to select word line pairs associated with differential-cell memory rows for refresh operations. Note that the refresh address bit RFA[10] is ignored in this case.

When memory block 200 is operating in single-cell mode, the modulo-2048 counter 311 provides a refresh address RFA[10:0], which is used to select word lines associated with single-cell memory rows for refresh operations.

The decoding of the refresh address signals RFA[10:0] is described in more detail below in connection with FIGS. 9–10.

The value of modulo-counter 311 is incremented at the end of each refresh cycle. The end of a refresh cycle is identified by a logic high LADS# signal and a rising edge of the RAS# signal. NAND gate 307, which is coupled to receive the LADS# signal and the inverse of the RAS# signal, provides a logic high signal to increment modulo-counter 311 at the end of each refresh cycle.

After modulo-counter 311 has generated all 1024 (or 2048) row addresses, this counter 311 drives the FULL signal high. This logic high FULL signal resets flip-flop 330, thereby de-activating the refresh request signal RREQ to a logic low state. The burst refresh operation is concluded when the refresh request signal RREQ is deactivated low.

As mentioned above, the refresh select signals REFSEL[1:0] are used to select one of three possible standby modes (1) non-retentive standby mode, (2) differential-cell standby mode, or (3) single-cell standby mode. Table 1 below defines the standby modes selected by the refresh select signals REFSEL[1:0].

TABLE 1

| REFSEL[1:0] | STANDBY MODE |
| --- | --- |
| "10" | No-Retention Standby Mode |
| "00" | Differential-Cell Standby Mode |
| "11" "01" | Single-Cell Standby Mode |

No-retention Standby Mode

The refresh select signals REFSEL[1:0] are coupled to input terminals of OR gate 302 (with REFSEL[1] being coupled to an inverting input terminal). OR gate 302 provides a logic low output signal when the refresh select signals REFSEL[1:0] have a value of "10". When the ZZ_MODE signal is asserted high at the beginning of the standby mode, the logic low output of OR gate 302 is latched into flip-flop 320. Flip-flop 320 provides this logic low signal to an input terminal of AND gate 308, thereby causing AND gate to de-assert the refresh request signal RREQ low. Because the refresh request signal RREQ is held at a logic low state, no refresh operations can be performed. In this manner, the "10" value of the REFSEL[1:0] signals prevent refresh operations from being performed. Note that the DIFF_MODE signal remains in a logic low state during no-retention standby mode.

When the ZZ_MODE signal is de-asserted low at the end of the standby mode, flip-flop 320 is set, thereby providing a logic high signal to the input terminal of AND gate 308, and enabling refresh operations to be performed during the subsequent normal (single-cell) operating mode.

Single-cell Refresh Mode

If the refresh select signals have a value of "11" or "01", then NOR gate 303 provides a logic low output signal to flip-flop 321. This logic low signal is latched into flip-flop 321 at the rising edge of the ZZ_MODE signal. This logic low signal propagates through flip-flops 322 and 323 in response to rising and falling edges of the refresh request signal RREQ. The logic low DIFF_MODE signal does not effect modulo-counter 311, and causes multiplexer 312 to continue to route the refresh enable signal R1 to flip-flop 330. Thus, refresh operations are performed in the single-cell mode, thereby retaining all data values stored during normal operating mode.

When the ZZ_mode signal is de-asserted low at the end of the single-cell standby mode, the low DIFF_MODE signal stays low, such that the refresh enable signal R1 of refresh timer 310 remains selected. The low state of the DIFF_MODE signal inhibits the generation of a positive pulse at the output terminal of one-shot device 309. Consequently, the refresh request signal RREQ is not automatically asserted high during the exit of the single-cell standby mode. Rather, memory block 200 simply continues operating in the single-cell mode.

Differential-cell Standby Mode

When the ZZ_MODE signal is asserted high at the beginning of the standby mode, and the refresh select signals REFSEL[1:0] have a value of "00", a single-cell mode to differential-cell mode conversion is performed.

The refresh select signals REFSEL[1:0] are coupled to the input terminals of NOR gate 303. NOR gate 303 provides a logic high output signal when the refresh select signals REFSEL[1:0] have a value of "100". When the ZZ_MODE signal is asserted high, the logic high output of NOR gate 303 is latched into flip-flop 321. Flip-flop 321 provides this logic high signal to the data input terminal of flip-flop 322 When the refresh request signal RREQ transitions to a logic high state, the logic high signal provided by flip-flop 321 is latched into flip-flop 322. The output of flip-flop 322 is provided as a control signal ZZD. This control signal ZZD is provided to the data input terminal of flip-flop 323 (and to the row decoder circuitry, as described in more detail below). As described in more detail below, a special burst refresh operation is performed in memory array 201 at this time. This special burst refresh operation performs a conversion from the single-cell mode to the differential cell mode.

The logic high control signal ZZD is latched into flip-flop 323 on the falling edge of the refresh request signal RREQ (after the special burst refresh operation is completed). At this time, flip-flop 323 provides a logic high differential mode signal DIFF_MODE. The high state of the DIFF_MODE signal indicates that memory block 200 is operating in the differential-cell standby mode. The DIFF_MODE signal is provided to the set input terminal of modulo counter 311, and to the control terminal of multiplexer 312. The logic high DIFF_MODE signal sets modulo counter 311 to a modulo-1024 counter (from a modulo-2048 counter), and causes multiplexer 312 to route refresh enable signal R40 to flip-flop 330. Thus, once in differential-cell standby mode, refresh operations (as determined by refresh enable signal R40) are performed less frequently than in single-cell mode.

When the ZZ_MODE signal is de-asserted low (signifying the return to normal operating mode), a differential-cell mode to single-cell mode conversion is performed. The low ZZ_MODE signal resets flip-flop 321, thereby providing a logic low signal to flip-flop 322. This logic low signal immediately resets flip-flop 322, thereby causing the ZZD control signal to transition to a logic low state. After a burst refresh is performed, the refresh request signal RREQ transitions to a logic low state, thereby causing flip-flop 323 to latch the logic low ZZD control signal, and provide a logic low DIFF_MODE signal.

Single-cell Mode to Differential-cell Mode Conversion

As mentioned above, the memory macro needs to go through a single-cell mode to differential-cell mode conversion before entering the differential-cell standby mode. The rising edge of the ZZD control signal indicates the beginning of the transition from single-cell (normal) mode to differential-cell standby mode, and the rising edge of the DIFF_MODE signal indicates the beginning of the differential-cell standby mode. Therefore, the high state of the ZZD control signal together with the low state of the DIFF_MODE signal defines the single-cell mode to differential-cell mode conversion period. The end of this conversion period is signaled by the rising edge of the DIFF_MODE signal.

As described above, the differential-cell standby mode is initiated by the rising edge of the ZZ_MODE signal when the REFSEL[1:0] signals have a logic "00" value. The logic high value provided by flip-flop 321 is not latched into flip-flop 322 until the next rising edge of the refresh request signal RREQ. When the refresh request signal RREQ is asserted high (in response to the refresh enable signal R1), the memory macro performs a special burst refresh operation, which refreshes the data values associated with the even word lines of memory array 201. This special burst refresh operation also converts the memory cells of memory array 201 from a single-cell mode to a differential-cell mode.

During each refresh access, a row of DRAM cells in array 201 is refreshed in the following manner. First, an even word line (e.g., word line WL0) is turned on in accordance with a single-cell read operation. After the data values stored in the memory cells associated with the even word line have developed an adequate signal strength on the bit lines, the sense amplifiers are turned on. After the sense amplifiers are turned on, the data signals on the bit lines exhibit a full signal swing (i.e., $V_{DD}$ and ground). At this time, a corresponding (adjacent) odd word line (e.g., word line WL1) is turned on. As a result, the data values stored in single-cell mode DRAM cells associated with the even word line are translated into data values stored in differential-cell mode DRAM cells associated with the even word line and the corresponding odd word line.

During the special burst refresh operation, this process is repeated for all of the rows in memory array 201, such that half of the data values stored in the single-cell mode DRAM cells are stored in differential-cell mode DRAM cells, and the other half of the data values stored in the single-cell mode DRAM cells are discarded.

At the end of the special burst refresh operation, modulo-counter 311 reaches a full count, and asserts the FULL signal high. In response, flip-flop 330 provides a logic low output signal, thereby causing the refresh request signal RREQ to be de-asserted low. At the falling edge of the refresh request signal RREQ, the logic high ZZD control signal is latched into flip-flop 323, thereby driving the DIFF_MODE signal to a logic high state. As a result, subsequent refresh operations are carried out in the differential-cell mode.

In an alternative embodiment, the single-cell to differential-cell conversion starts with all of the odd word lines turned on, and the bit lines being pre-charged to a potential of approximately half the $V_{DD}$ supply voltage. As a result, the data stored in the memory cells associated with the odd word lines are neutralized. The charges stored in the capacitors of these memory cells have no effect on the subsequent data sensing operations (i.e., the read operations that activate the even word lines).

Differential-cell Mode to Single-cell Mode Conversion

As mentioned above, the memory macro needs to go through a differential-cell mode to single-cell mode conversion before re-entering the normal single-cell operating mode. The differential-cell standby mode is exited in response to the falling edge of the ZZ_MODE signal. When in the differential-cell standby mode, the DIFF_MODE signal will have a logic high state when the ZZ_MODE signal transitions to a logic low state. Under these conditions, NOR gate 306 provides a logic high output signal to one-shot device 309. In response, one-shot device 309 provides a positive output pulse to flip-flop 330 and OR gate 301. This positive pulse sets the refresh request signal RREQ to a logic high state. The high state of the refresh request signal RREQ causes memory block 200 to carry out a burst refresh operation until modulo-counter 311 reaches a full count. Because the DIFF_MODE signal remains high, the refresh operations are performed in the differential-cell mode. When the burst refresh operation is complete, the refresh request signal RREQ is de-asserted low. Note that the positive pulse at the output of one-shot device 309 also resets refresh timer 310, thereby avoiding the generation of back-to-back refresh requests.

The falling edge of the ZZ_MODE signal resets flip-flop 321, thereby causing this flip-flop to provide a logic low-signal to flip-flop 322. This logic low signal resets flip-flop 322, such that flip-flop 322 provides a logic low ZZD signal to flip-flop 323. When the burst refresh operation is completed, and the refresh request signal RREQ is de-asserted low, flip-flop 323 latches this logic low signal, and in response, provides a logic low DIFF_MODE signal. The low state of the DIFF_MODE signal causes multiplexer 312 to select the refresh enable signal R1 output from refresh timer 310 for generating refresh requests. As described in more detail below, the low states of the DIFF_MODE and ZZD signals also cause the row decoder circuitry to operate in single-cell mode. Thus, after the DIFF_MODE signal transitions to a logic low state, the memory macro completes the exit of the standby mode and subsequent operations are carried out using single-cell mode. Note that normal accesses can occur during this burst refresh operation by performing the normal accesses during one half of the clock period, and performing the refresh operations during the other half of the clock period. However, these normal accesses are limited to the reduced address range of the differential-cell mode.

In an alternative embodiment, refresh controller 221 incorporates a counter to determine the time elapsed between the last burst refresh operation and the time that the standby mode is exited. This counter is reset at the end of each burst refresh operation, and is stopped in response to the falling edge of the ZZ_MODE signal. The value latched in the counter indicates the elapsed time between the last burst refresh operation and the falling edge of the ZZ_MODE signal. The value of the counter is compared with a predetermined value that is representative of the required refresh period of the single-cell mode. If the elapsed time is greater than the required refresh period of the single-cell mode, then a burst refresh operation is performed using the differential-cell mode. The burst refresh operation performed when exiting the standby mode is necessary to guarantee sufficient data signal for single-cell mode operation. The standby mode is then exited, and normal operation continues in the single-cell mode, using the refresh enable signal R1. Again, note that normal accesses can occur during this burst refresh operation by performing the normal accesses during one half of the clock period, and performing the refresh operations during the other half of the clock period. However, these normal accesses are limited to the reduced address range of the differential-cell mode.

If the elapsed time is less than the required refresh period of the single-cell mode, then no burst refresh operation is performed. The standby mode is exited and normal operation continues in the single-cell mode, using the refresh enable signal R1. This embodiment has the advantage of reduced refresh power, but at the expense of control complexity, especially for applications where memory block 200 often enters and exits the standby mode.

Figure 6:
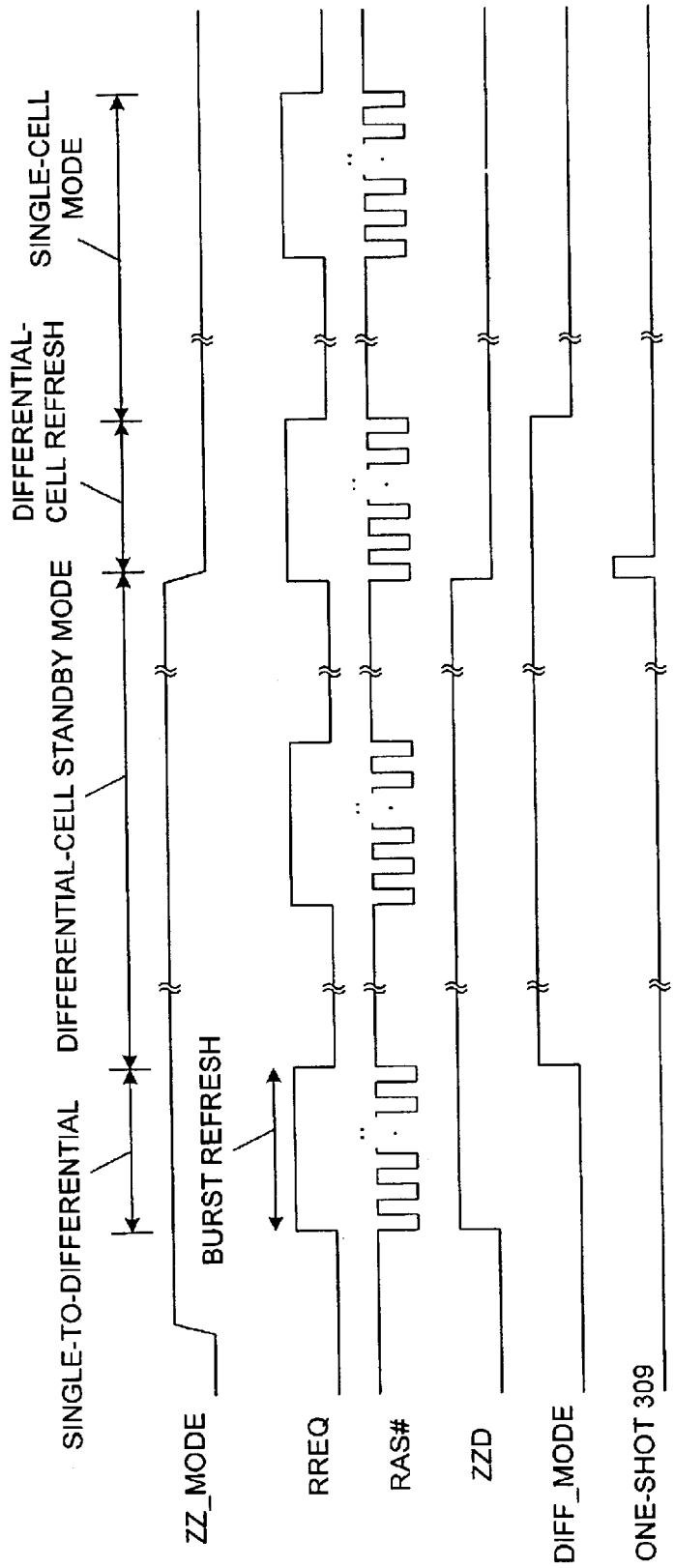
FIGS. 6 and 7 are waveform diagram that illustrate the timing of various control signals of the refresh controller of FIG. 4 while entering and exiting a differential-cell standby mode, in accordance with one embodiment of the present invention.

FIG. 6 is a waveform diagram illustrating the timing of the ZZ_MODE, RREQ, RAS#, ZZD, DIFF_MODE and one-shot control signals of refresh controller 221 as memory block 200 enters and exits differential-cell standby mode. FIG. 6 illustrates the burst refresh operations, which use single-to-differential cell timing when entering the standby mode, differential-cell timing during (and exiting) the standby mode, and single-cell timing after exiting the standby mode.

Figure 7:
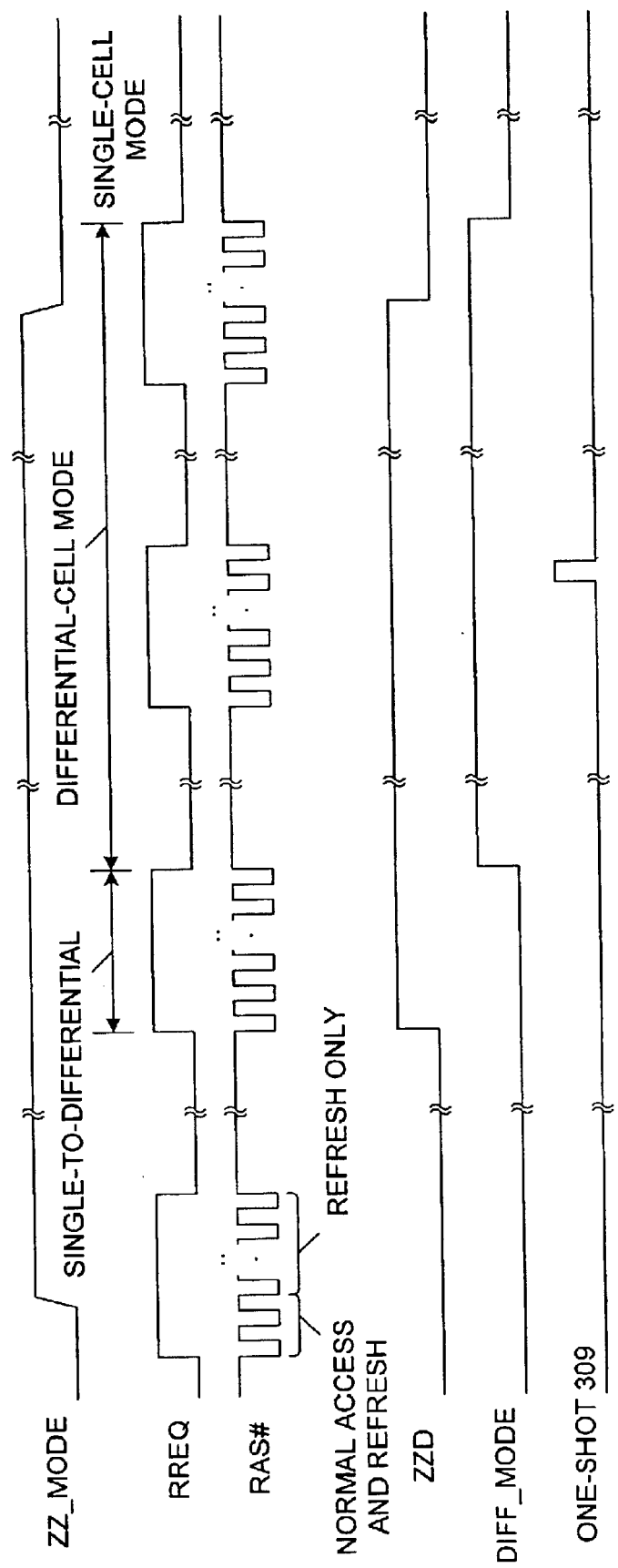

FIG. 7 is a waveform diagram illustrating the timing of the ZZ_MODE, RREQ, RAS#, ZZD, DIFF_MODE and one-shot control signals of refresh controller 221 as memory block 200 enters and exits the differential-cell standby mode while the refresh request signal RREQ is high. That is, FIG. 7 illustrates the waveform timing when a burst refresh is occurring in the single-cell mode, and the memory block 200 attempts to enter the differential-cell standby mode. Similarly, FIG. 7 illustrates the waveform timing when a burst refresh is occurring in the differential-cell standby mode, and the memory block 200 attempts to enter the single-cell normal operating mode.

Notice that edge-triggered flip-flop 322 assures that the ZZD control signal is not asserted high until the refresh request signal RREQ goes through a low-to-high transition. Therefore, even if the refresh request signal RREQ is high at the rising edge of the ZZ_MODE signal, the ZZD control signal is not asserted high until the refresh request signal RREQ goes low and then high again. Thus, if memory block 200 is performing a burst refresh when the ZZ MODE signal is asserted high, then memory block 200 continues the refresh in the single-cell mode. The single-to-differential cell conversion is not carried out until the next time the refresh request signal RREQ is asserted high.

However, if the refresh request signal RREQ is asserted and a burst refresh is being carried out when exiting the differential-cell standby mode, then memory block 200 resumes normal single-cell mode operation after the burst refresh is completed. Note that the positive pulse provided at the output terminal of one-shot device 309 has no effect on the output of flip-flop 330, because the refresh request signal RREQ is already at a logic high state. The low state of the ZZ MODE signal drives the ZZD control signal low. After the burst refresh is completed, the refresh request signal RREQ transitions to a logic low state. The falling edge of the refresh request signal RREQ causes flip-flop 323 to latch the low state of the ZZD signal, thereby driving the DIFF_MODE signal to a logic low state. At this time, memory block 200 has made the transition from differential-cell operation to normal single-cell operation.

Note that before the ZZ_MODE signal transitions to a logic high state or after the ZZ_MODE signal transitions to a logic low state, memory block 200 handles both external access and internal refresh operations. The present embodiment employs the same scheme as described in U.S. Pat. No. 6,504,780. That is, external accesses are carried out while the external clock signal CLK has a logic high state, and refresh operations are performed during the time that the external clock signal CLK has a logic low state. Therefore, some of the RAS# pulses that occur before the ZZ_MODE signal transitions to a logic high state or after the ZZ_MODE signal transitions to a logic low state can be memory cycles for external accesses. After the ZZ_MODE signal goes high, the external clock signal CLK can be stopped. At this time, the memory array sequencer 222 switches to an internal clock generator formed by a ring oscillator for generating the memory control signals: RAS#, SEN#, and PRC#. This internal clock generator is described in more detail below.

Memory Array Sequencer 222

Figure 8:
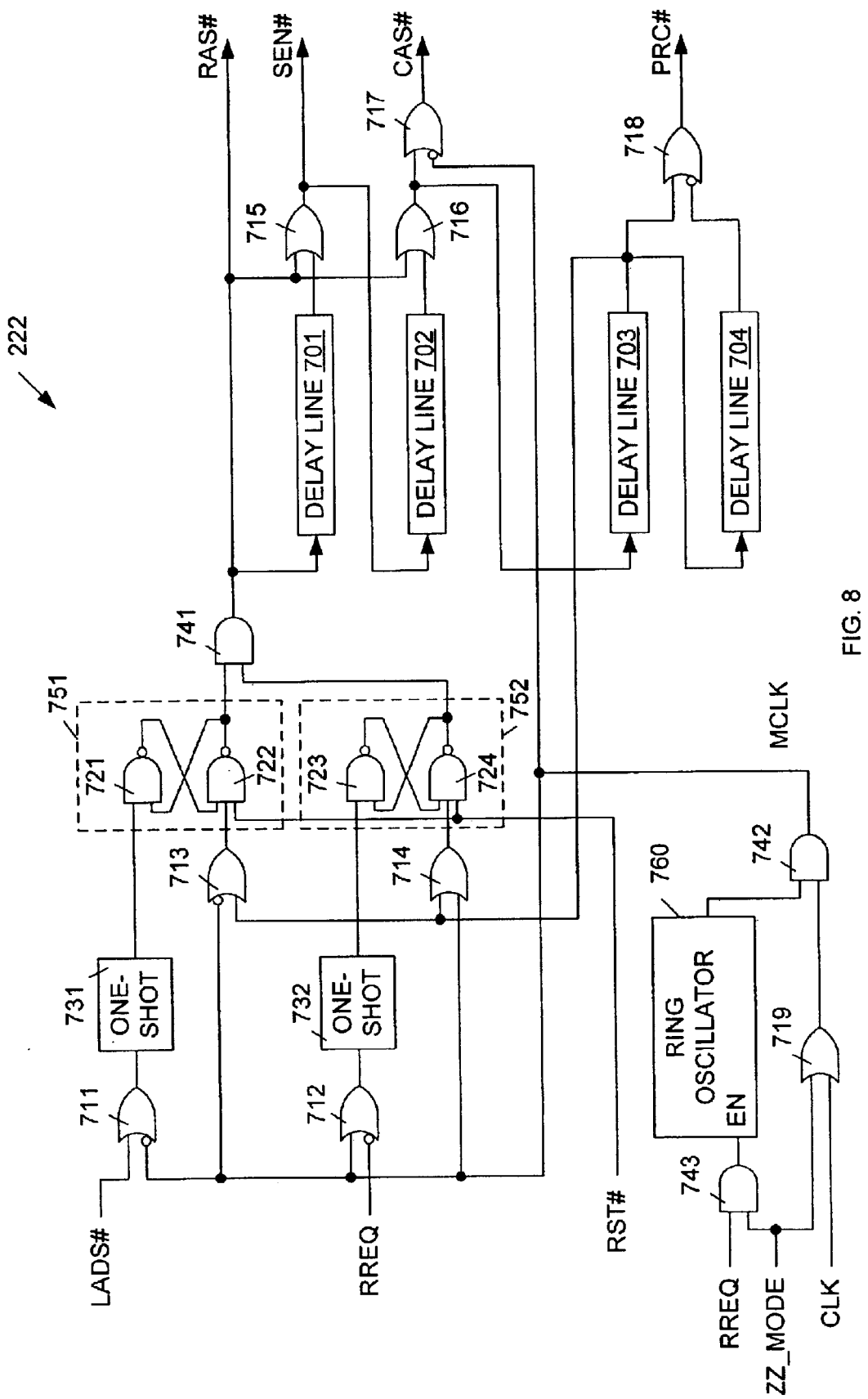
FIG. 8 is a circuit diagram illustrating a memory array sequencer of the memory block of FIG. 2 in accordance with one embodiment of the present invention.

FIG. 8 is a circuit diagram illustrating memory array sequencer 222 in accordance with one embodiment of the present invention. Memory array sequencer 222 includes delay lines 701–704, OR gates 711–719, NAND gates 721–724, one–shot devices 731–732, AND gates 741–743 and ring oscillator 760. NAND gates 721–722 are cross-coupled to form latch 751, and NAND gates 723–724 are cross-coupled to form latch 752.

AND gate 743 is coupled to receive the refresh request signal RREQ and the ZZ_MODE signal. The output terminal of AND gate 743 is coupled to the–enable input terminal of ring oscillator 760. OR gate 719 is coupled to receive the ZZ_MODE signal and the external clock signal CLK. AND gate 742 is coupled to receive the output of ring oscillator 760 and the output signal provided by OR gate 719. AND gate 742 provides a memory clock signal MCLK that controls the timing of the signals RAS#, SEN#, CAS# and PRC#. The remaining circuitry of memory access controller 222 (i.e., the circuitry other than ring oscillator 760, OR gate 719 and AND gate 742) has been described in U.S. Pat. No. 6,504,780. A brief description of memory access controller 222 is provided below.

When either the ZZ_MODE signal or the RREQ signal has a logic low state, ring oscillator 760 is disabled, causing this oscillator 760 to provide a logic high signal to AND gate 742. As a result, the external clock signal CLK is propagated through OR gate 710 and AND gate 742, and provided as the MCLK signal. Under these conditions, memory array sequencer 222 operates as follows.

Delay lines 701, 702, 703 and 704 introduce signal delays d1, d2, d3, and d4, respectively. In general, memory array sequencer 222 activates the RAS#, SEN#, CAS# and PRC# signals at predetermined times during half of a CLK period (e.g., when the CLK signal is high). As a result, an external access (read or write) may be performed during one half of a CLK period, and a refresh access may be performed during the other half of the same CLK period (e.g., when the CLK signal is low).

When memory block 200 is started, the RST# signal is activated low, thereby setting flip-flops 751 and 752, such that these flip-flops provide logic high output signals to AND gate 741. The RST# signal is then de-activated high, thereby allowing flip-flops 751 and 752 to operate in response to the other applied signals. When there is no external access to memory block 200, the latched address strobe signal LADS# is de-activated high. When there is no refresh access pending in memory block 200, the refresh request signal RREQ is de-activated low. Under these conditions, OR gates 711 and 712 provide logic high signals to one-shot circuits 731 and 732, respectively. In response, one-shot circuits 731–732 provide logic high signals to flip-flops 751–752, respectively, thereby causing flip-flops 751–752 to continue to provide logic high output signals to AND gate 741. The logic high output of AND gate 741 de-activates the RAS#, SEN#, CAS# and PRC# control signals high. At this time, memory array 201 is idle.

The latched address strobe signal LADS# is activated low during an external access. The low state of the LADS# signal, along with the high state of the CLK signal causes the output of OR gate 711 to go low. The falling edge at the output of OR gate 711 causes one-shot circuit 731 to generate a negative going pulse having a width substantially shorter than half of the CLK period. This negative pulse resets the output of flip-flop 751 to a logic low value. The logic low value provided by flip-flop 751 causes AND gate 741 to activate the RAS# signal low. The low state of the RAS# signal propagates through delay lines 701, 702, 703 and 704 (as well as OR gates 715–717) to drive signals SEN#, CAS# and PRC# low in sequence.

The logic low signal provided by delay line 703 propagates through delay line 704 after an additional delay of d4. The logic low output of delay line 704 is provided to the inverting input terminal of OR gate 718. As a result, the PRC# signal is de-activated high a delay d4 after being activated low.

The low state of the output of delay line 703 and the high state of the CLK signal cause OR gate 713 to provide a logic low value to flip-flop 751, thereby setting the output of flip-flop 751 to a logic high' state. In response, AND gate 741 deactivates the RAS# signal to a logic high state. The logic high RAS# signal is applied to OR gates 715 and 716, thereby causing the SEN# and CAS# signals, respectively, to be immediately de-activated high. The logic high value provided by OR gate 716 propagates through delay line 703 after a delay of d3, thereby causing OR gate 718 to continue to de-activate the PRC# signal high. The logic high value provided by delay line 703 propagates through delay line 704 after a delay of d4, and is applied to the inverting input terminal of OR gate 718. In this manner, the output signals provided by delay lines 701–704 are reset to their original logic high states, such that these delay lines are ready for the next access.

The total delay introduced by delay lines 701, 702, 703, and 704 is designed to be less than or equal to a half period of the CLK signal. Notice that the RAS# signal is recovered to a logic high state before the CLK signal transitions from the high state to a low state. As a result, another memory cycle can be started at the falling edge of the CLK signal. To ensure that the SEN# and CAS# signals are generated properly during back-to-back memory cycles, the outputs of delay lines 701 and 702 are required to be de-activated high before the RAS# signal is activated low again.

The delay d4 introduced by delay line 704 is longer than the delay d1 introduced by delay line 701 or the delay d2 introduced by delay line 702. As a result, when the PRC# signal is de-activated high, delay lines 701 and 702 are already providing logic high output signals. In other embodiments, delay line 701 or delay line 702 can have a longer delay than delay line 704. However, in such embodiments, a fast reset must be provided-on delay lines 701 and 702, thereby ensuring that the output signals provided by delay lines 701 and 702 recover to logic high states before the activation period of the PRC# signal expires.

A memory refresh operation is performed when the refresh request signal RREQ is activated to a logic high value and the CLK signal has a logic low value. That is, refresh operations are only performed during the half period that the CLK signal has a logic low state. The high state of the RREQ signal and the low state of CLK signal causes OR gate 712 to provide a logic low output signal to one-shot circuit 732. In response, one-shot circuit 732 provides a negative going pulse having a pulse width substantially shorter than a half period of the CLK signal. The negative pulse resets the output of flip-flop 752 to a logic low state. This logic low output signal provided by flip-flop 752 is applied to an input terminal of AND gate 741. In response, AND gate 741 activates the RAS# signal low. The low state of RAS# signal propagates through delay line 701, thereby causing the SEN# signal to be activated low after delay d1. The low state of the SEN# signal propagates through delay line 702 after delay d2, thereby causing OR gate 716 to provide a logic low output signal to OR gate 717. Because the inverting input terminal of OR gate 717 receives a logic low CLK signal at this time, the CAS# signal remains de-activated high. The CAS# signal is thereby suppressed during the refresh access (because the refresh access does not involve a column access).

The logic low signal provided by OR gate 716 propagates through delay line 703, thereby providing a low signal to the non-inverting input terminal of OR gate, and causing the PRC# signal to be activated low after delay d3. The logic low state of the output signal provided by delay line d3 propagates through delay line 704, thus providing a logic low signal to the inverting input terminal of OR gate 718 after delay d4. OR gate 718 de-activates the PRC# signal high in response to the logic low signal provided to the inverting input terminal of OR gate. The low state of the output signal provided by delay line 703 and the low state of the CLK signal cause OR gate 714 to provide a logic low output signal to flip-flop 752. In response, flip-flop 752 provides a logic high signal to AND gate 741, thereby causing AND gate 741 to deactivate the RAS# signal high. The high state of the RAS# signal causes OR gate 715 to provide a logic high output signal, thereby causing the SEN# signal to be deactivated high. The high state of the RAS# signal also causes OR gate 716 to provide a logic high output signal. After a delay of d3, the logic high output signal provided by OR gate 716 propagates through delay line 703, to the non-inverting input terminal of OR gate 718, thereby causing OR gate 718 to continue to de-activate the PRC# signal high. The logic high value provided by delay line 703 propagates through delay line 704 after a delay of d4, and is applied to the inverting input terminal of OR gate 718. In this manner, the output signals provided by delay lines 701–704 are reset to their original logic high states, such that these delay lines are ready for the next access.

When both the ZZ_MODE and RREQ signals are asserted high, ring oscillator 760 is enabled. In response, ring oscillator 760 provides a clock signal to AND gate 742. The period of this clock signal is a little longer than the memory refresh cycle (i.e., the time required for the memory array to complete a refresh operation). The logic high ZZ_MODE signal is also provided to OR gate 719, thereby causing OR gate 719 to provide a logic high signal to AND gate 742. As a result, the clock signal provided by ring oscillator 760 is transmitted through AND gate 742 as the MCLK signal, for synchronizing the refresh operations. The external clock signal CLK can be disabled at this time.

Memory array sequencer 222 operates in the manner described above, thereby generating the RAS#, SEN# and PRC# signals while the refresh request signal RREQ is asserted high.

Figure 9:
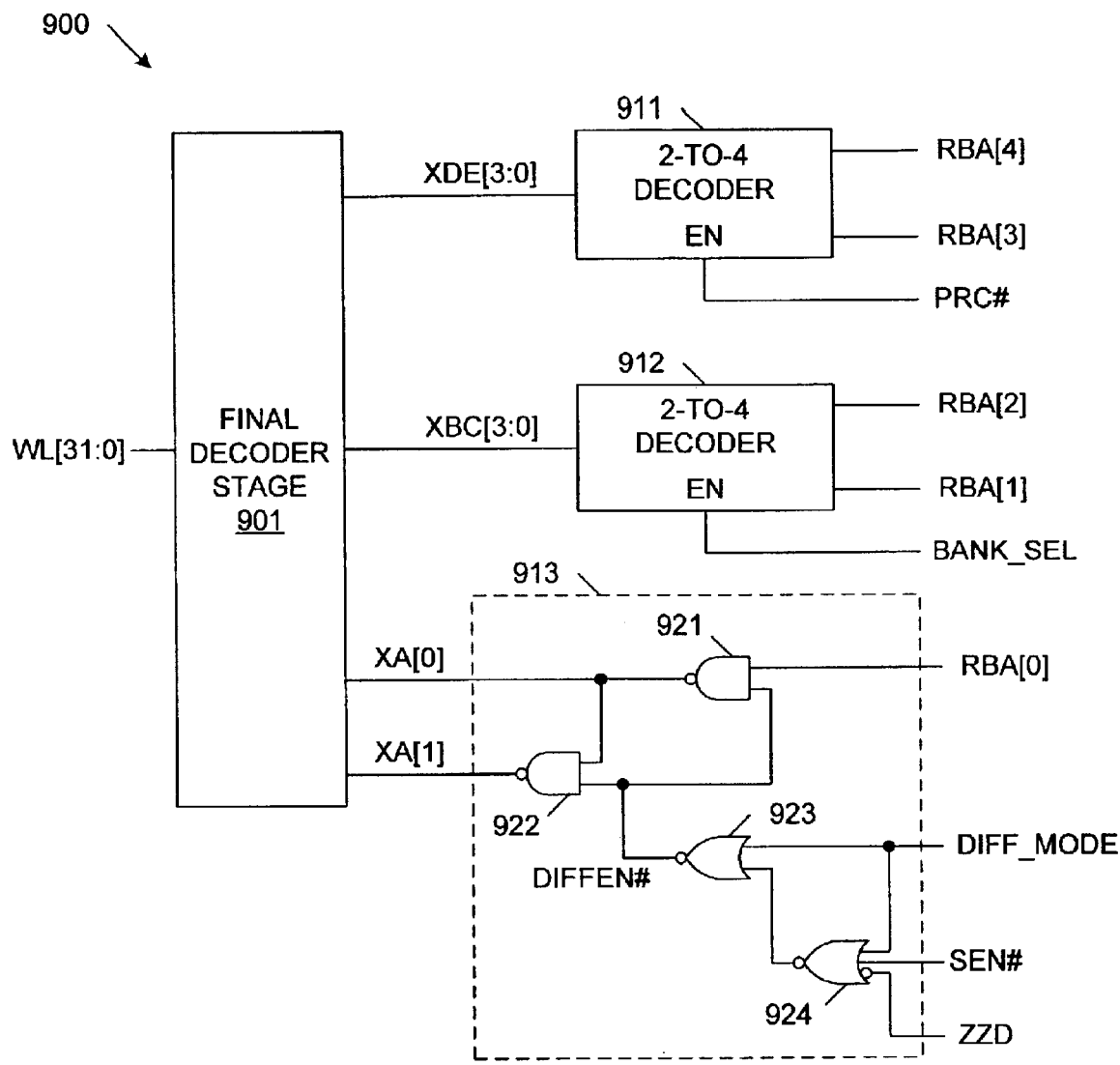
FIG. 9 is a circuit diagram of a row decoder associated with one of the memory banks of the memory block of FIG. 2 in accordance with one embodiment of the present invention.

FIG. 9 is a circuit diagram of a row decoder 900 for one of the memory banks 0–63 of memory array 201. Row decoder 900 includes pre-decoders 911–913 and final decoder stage 901. In the described embodiment, each of memory banks 0–63 has a dedicated row decoder. The memory bank associated with row decoder 900 includes 32 rows of DRAM cells in the single-cell mode, and 16 rows of DRAM cells in the differential-cell mode. Row address RBA[4:0] is provided to each of the row decoders. As described below, row address RBA[0] is ignored during differential-cell mode.

Row decoder 900 has a traditional structure of 2 stage decoding with a 3 sets of pre-decoders 911–913, followed by a final decoder stage 901.

Pre-decoder 911 is a 2-to-4 decoder that provides a 4-bit output signal XDE[3:0] in response to the RBA[4:3] row address signals. Pre-decoder 911 is enabled in response to the pre-charge signal PRC#. The operation of pre-decoder 911 is defined below in Table 2.

TABLE 2

| RBA[4] | RBA[3] | PRC# | XDE[3] | XDE[2] | XDE[1] | XDE[0] |
|---|---|---|---|---|---|---|
| 0 | 0 | 1 | 0 | 0 | 0 | 1 |
| 0 | 1 | 1 | 0 | 0 | 1 | 0 |
| 1 | 0 | 1 | 0 | 1 | 0 | 0 |
| 1 | 1 | 1 | 1 | 0 | 0 | 0 |
| X | X | 0 | 0 | 0 | 0 | 0 |

Pre-decoder 912 is a 2-to-4 decoder that provides a 4-bit output signal XBC[3:0] in response to the RBA[2:1] row address signals. Pre-decoder 912 is enabled in response to a bank select signal BANK_SEL. The BANK_SEL signal is activated when the bank address RBA[10:5] identifies the memory bank associated with row decoder 900. The operation of pre-decoder 912 is defined below in Table 3.

TABLE 3

| RBA[2] | RBA[1] | Bank_Sel | XBC[3] | XBC[2] | XBC[1] | XBC[0] |
|---|---|---|---|---|---|---|
| 0 | 0 | 1 | 0 | 0 | 0 | 1 |
| 0 | 1 | 1 | 0 | 0 | 1 | 0 |
| 1 | 0 | 1 | 0 | 1 | 0 | 0 |
| 1 | 1 | 1 | 1 | 0 | 0 | 0 |
| X | X | 0 | 0 | 0 | 0 | 0 |

Pre-decoder 913 is formed by NAND gates 921–922 and NOR gates 923–924. The RBA[0] row address signal is provided to NAND gate 921. The DIFF_MODE signal is provided to input terminals of NOR gates 923 and 924. The sense enable signal SEN# and the ZZD control signal are provided to input terminals of NOR gate 924. The output terminal of NOR gate 924 is provided to the input terminal of NOR gate 923. The output terminal of NOR gate 923, which is labeled as the differential-cell mode enabled signal DIFFEN#, is provided to input terminals of NAND gates 921–922. The output terminal of NAND gate 921 provides the output signal XA[0] to NAND gate 922 and to final decoder 901. NAND gate 922 provides the output signal XA[1] to final decoder 901. The operation of pre-decoder 913 is described below.

Figure 10:
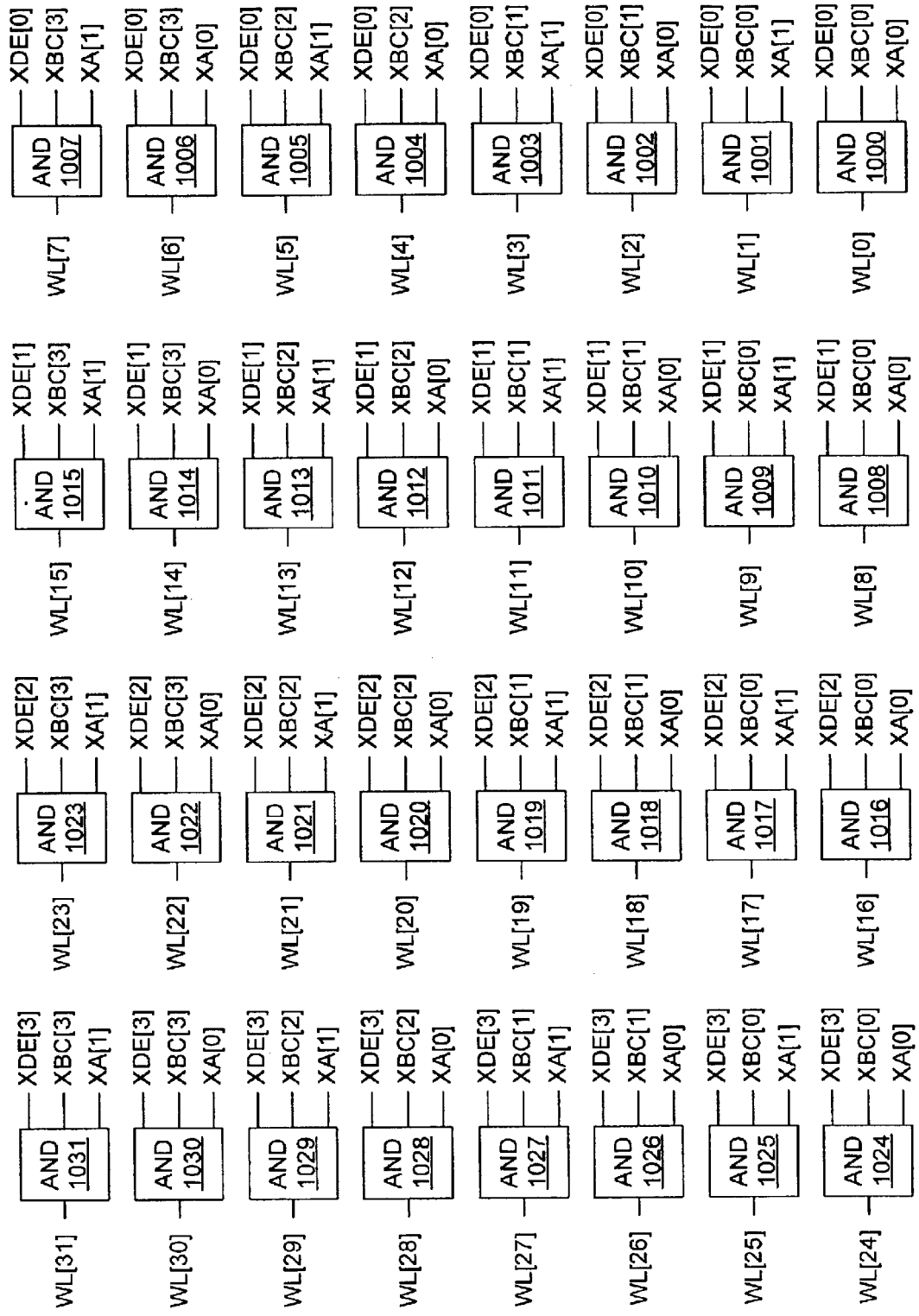
FIG. 10 is a circuit diagram illustrating a final decoder stage of the row decoder of FIG. 9 in accordance with one embodiment of the present invention.

FIG. 10 is a circuit diagram illustrating final decoder 901. Final decoder 901 includes 32 3-input AND gates 1000–1031, which are coupled to receive the XDE[3:0], XBC[3:0] and XA[1:0] signals as illustrated. In response, AND gates 1000–1031 provide the word line enable signals WL0–WL31, respectively, which are used to activate and de-activate the 32 word lines of the associated memory bank.

During single-cell mode operation, the DIFF_MODE signal has a logic low state, thereby causing NOR-gate 923 to drive the DIFFEN# signal to a logic high state. As a result, NAND gate 921 provides an output signal XA[0] that is equal to the inverse of the row address signal RBA[0], and NAND gate 922 provides an output signal XA[1] that is equal to the row address signal RBA[0].

During single-to-differential cell conversion, the ZZD signal is asserted is high, and the DIFF_MODE signal is de-asserted low. Before the sense-amplifiers have been turned on, and the SEN# signal remains de-asserted high. Under these conditions, the logic high SEN# signal causes NOR gate 924 to provide a logic low output signal to NOR gate 923. In response, NOR gate 923 provides a logic high DIFFEN# signal. As a result, the XA[0] and XA[1] signals have different values. Consequently, a single word line is turned on in response to the entire row address RBA[4:0].

In the described embodiment, the first row address RBA [4:0] has a value of "00000", which corresponds with the even word line WL0. As a result, XDE[3:0] has a value of "0001", XBC[3:0] has a value of "0001" and XA[1:0] has a value of "01". As a result, AND gate 900 activates the word line signal WL[0]. At this time the data values associated with even word line WL0 are developed on the bit lines of the memory bank. The SEN# signal is then activated low, thereby latching the data values on the bit lines into the sense-amplifiers.

The logic low SEN# signal causes NOR gate 924 to provide a logic high output signal to NOR gate 923, thereby causing the DIFFEN# signal to transition to a logic low state. The logic low DIFFEN# signal causes NOR gates 921–922 to provide XA[1:0] signals having a value of "11". As a result, both of the word lines addressed by row address signals RBA[4:1] are activated. In the present example, AND gates 1000 and 1001 activate the associated word line signals WL[0] and WL[1]. That is, both the even word line WL0 and the adjacent odd word line WL1 are activated. As a result, the data values stored in the sense amplifiers are written back to the DRAM cells associated with word lines WL0 and WL1 in differential mode.

The pre-charge signal PRC# subsequently transitions to a logic low state, thereby disabling 2-to-4 decoder 911, such that this decoder provides XDE[3:0] signals having a value of "0000". These XDE[3:0] signals turn off all of the word lines WL0–WL31, thereby ending the single-to-differential conversion of the first two rows of the memory bank.

The above described process is repeated, each time providing a row address RBA[4:0] that corresponds with the next even word line. When one memory bank has been converted to differential-cell mode, processing continues to the next memory bank, until all of memory banks 0–63 have been converted to differential-cell mode.

After all of the memory banks 0–63 have been converted to differential-cell mode, the refresh request signal RREQ is de-asserted low, and the DIFF_MODE signal transitions to a logic high state in the manner described above. The logic high DIFF_MODE signal causes NOR gate 923 to drive the DIFFEN# signal to a logic low state. This in turn causes NAND gates 921 and 922 to drive the XA[1] and XA[0] signals high. The high states of the XA[1] and XA[0] signals cause both the odd and even word lines associated with the address RBA[4:1] to turn on simultaneously, thereby facilitating differential-cell standby mode operation.

Figure 11:
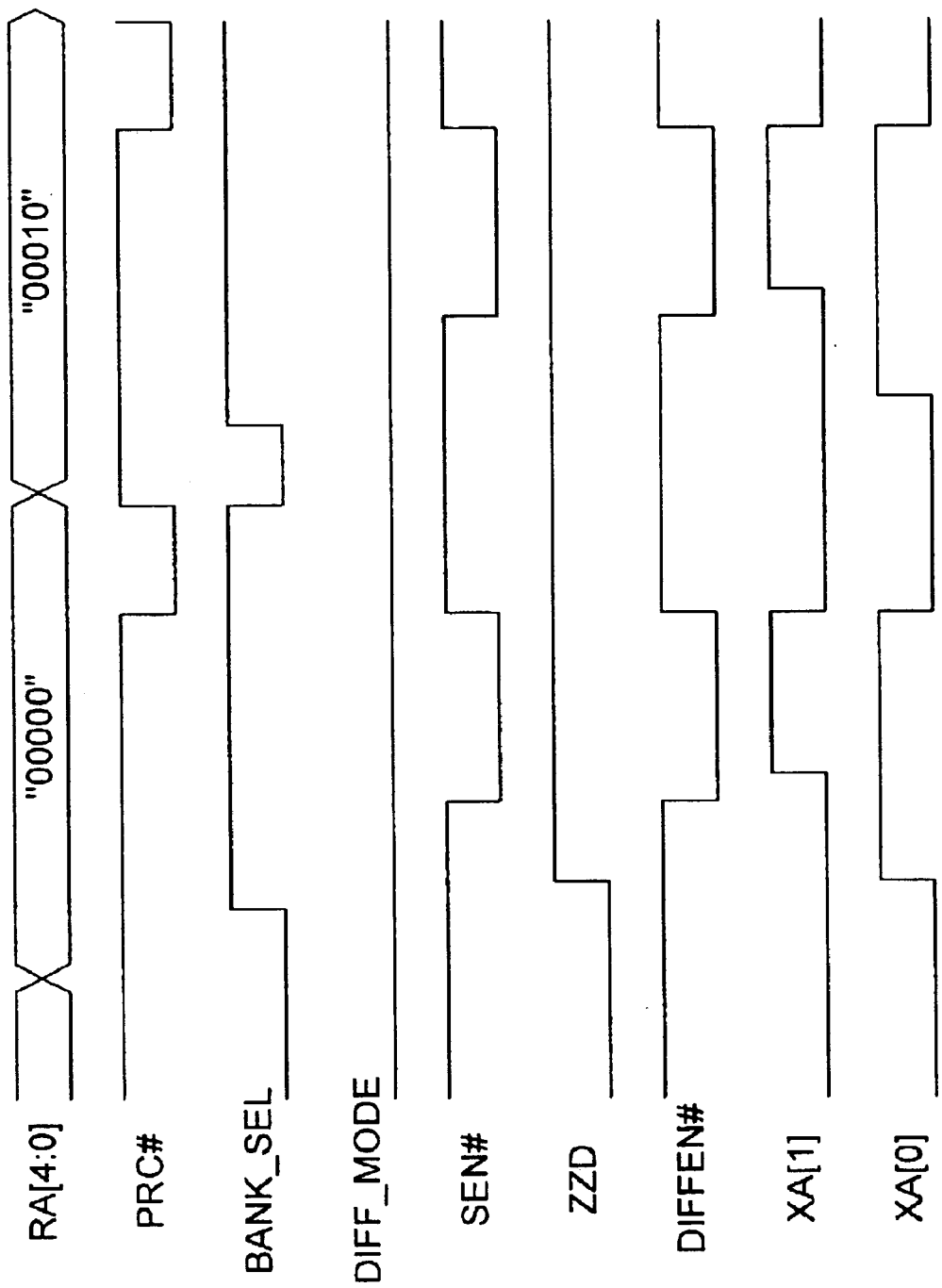
FIG. 11 is a waveform diagram that illustrates control signals of the row decoder of FIG. 9 in accordance with one embodiment of the present invention.

FIG. 11 is a waveform diagram summarizing the above-described row decoder signals during the first two operations of a single-to-differential cell conversion.

As described above, when exiting the differential-cell standby mode, the ZZD signal is de-asserted low and the DIFF_MODE signal initially stays high. The logic high DIFF_MODE signal ensures that the DIFFEN# signal remains asserted low, such that the final burst refresh operation is carried out in differential-cell mode. After the burst refresh operation is complete, the DIFF_MODE signal is de-asserted to a logic low state. At this time, the logic low ZZD signal causes NOR gate 924 to provide a logic low signal to one input terminal of NOR gate 923, and the low DIFF_MODE signal is provided to the other input terminal of NOR gate 923. As a result, NOR gate 923 de-asserts the DIFFEN# signal high, thereby causing the subsequent operations to be performed in single-cell mode.

Although the invention has been described in connection with several embodiments, it is understood that this invention is not limited to the embodiments disclosed, but is capable of various modifications, which would be apparent to a person skilled in the art. For example, although the entry into differential cell mode has been described as enabling even word lines followed by odd word lines, it is understood that this sequence can be reversed in other embodiments. Thus, the invention is limited only by the following claims.

We claim:

1. A method of operating a memory system having an array of memory cells that require periodic refresh, the method comprising:
   operating the array of memory cells in a single-cell mode during normal operating conditions;
   entering a standby mode from the normal operating conditions, wherein upon entering the standby mode, data stored in the array of memory cells in the single-cell mode are converted into data stored in the array of memory cells in a differential cell mode; and then
   operating the array of memory cells in the differential-cell mode after entering the standby mode.

2. The method of claim 1, further comprising:
   operating the array of memory cells in response to a system clock signal during normal operating conditions;
   disabling the system clock signal during the standby mode;
   generating a local clock signal during the standby mode; and
   operating the array of memory cells in response to the local clock signal during the standby mode.

3. The method of claim 1, further comprising:
   generating a first refresh request signal, having a first period, for implementing periodic refresh operations during normal operating conditions; and
   generating a second refresh request signal, having a second period, for implementing periodic refresh operations during standby mode, wherein the second period is longer than the first period.

4. The method of claim 3, wherein the second period is more than twenty five times longer than the first period.

5. The method of claim 3, wherein the second period is about 40 times longer than the first period.

6. The method of claim 3, wherein the first and second periods are automatically adjusted with respect to temperature.

7. The method of claim 1, further comprising:
   entering normal operating conditions from the standby mode, wherein upon entering normal operating conditions, data stored in the array of memory cells in the differential-cell mode is converted into data stored in the array of memory cells in the single-cell mode; and then
   operating the array of memory cells in the single-cell mode after entering normal operating conditions.

8. The method of claim 7, further comprising performing normal accesses to the data stored in the array of memory cells in the differential-cell mode while entering normal operating conditions from the standby mode.

9. The method of claim 1, wherein the step of entering the standby mode comprises:
activating an even word line of the array of memory cells, thereby developing data values on bit lines of the array of memory cells in a single-cell mode; then
activating sense amplifiers, thereby amplifying the data values on the bit lines; then
activating an odd word line of the array of memory cells, adjacent to the even word line, thereby writing the amplified data values to memory cells associated with the even and odd word lines in a differential-cell mode; and then
de-activating the even and odd word lines.

10. The method of claim 1, further comprising:
performing accesses to the array of memory cells while a system clock signal has a first logic state during normal operating conditions; and
performing refresh operations to the array of memory cells while the system clock signal has a second logic state during-normal operating conditions.

11. A method of operating a memory system having an array of memory cells that require periodic refresh, the method comprising:
operating the array of memory cells in a single-cell mode during normal operating conditions;
entering a standby mode from the normal operating conditions; and
selecting the standby mode from a plurality of possible standby modes.

12. The method of claim 11, wherein the plurality of possible standby modes comprises a differential-cell standby mode and a single-cell standby mode.

13. The method of claim 12, wherein the plurality of possible standby modes comprises a no-retention standby mode, in which refresh operations are not performed.

14. The method of claim 11, further comprising:
operating the array of memory cells in response to a system clock signal during normal operating conditions;
disabling the system clock signal during the standby mode;
generating a local clock signal during the standby mode; and
operating the array of memory cells in response to the local clock signal during the standby mode.

15. The method of claim 12, further comprising:
generating a first refresh request signal, having a first period, for implementing periodic refresh operations during normal operating conditions, and during standby mode when the standby mode is the single-cell mode; and
generating a second refresh request signal, having a second period, for implementing periodic refresh operations during standby mode when the standby mode is the differential-cell mode, wherein the second period is longer than the first period.

16. The method of claim 15, wherein the second period is more than twenty five times longer than the first period.

17. The method of claim 15, wherein the second period is about 40 times longer than the first period.

18. The method of claim 15, wherein the first and second periods are automatically adjusted with respect to temperature.

19. The method of claim 11, further comprising:
performing accesses to the array of memory cells while a system clock signal has a first logic state during normal operating conditions; and
performing refresh operations to the array of memory cells while the system clock signal has a second logic state during normal operating conditions.

20. A method of operating a memory system having a plurality of memory blocks that require periodic refresh, the method comprising:
operating the memory blocks in a single-cell mode during normal operating conditions;
entering a standby mode from the normal operating conditions; and
selecting the a first standby mode for a first set of one or more memory blocks of the plurality of memory blocks; and
selecting a second standby mode for a second set of one or more memory blocks of the plurality of memory blocks, the first standby mode being different than the second standby mode.

21. The method of claim 20, wherein the first standby mode comprises a differential-cell standby mode and the second standby mode comprises a single-cell standby mode.

22. The method of claim 20, wherein the first standby mode comprises a differential-cell standby mode and the second standby mode comprises a non-retentive standby mode.

23. The method of claim 20, wherein the first standby mode comprises a single-cell standby mode and the second standby mode comprises a non-retentive standby mode.

24. The method of claim 20, further comprising selecting a third standby mode for a third set of one or more memory blocks of the plurality of memory blocks, the third standby mode being different than the first and second standby modes.

25. The method of claim 20, further comprising:
operating the memory blocks in response to a system clock signal during normal operating conditions;
disabling the system clock signal during the standby mode;
generating a local clock signal during the standby mode; and
operating the memory blocks in response to the local clock signal during the standby mode.

26. The method of claim 25, further comprising generating the local clock signal only when performing refresh operations in the standby mode.

27. The method of claim 20, further comprising:
performing accesses to the memory blocks a system clock signal has a first logic state during normal operating conditions; and
performing refresh operations to memory blocks while the system clock signal has a second logic state during normal operating conditions.

28. A refresh controller for controlling refresh operations in an array of memory cells that require refresh operations to retain data, the refresh controller comprising:
a refresh timer configured to generate a first refresh enable signal having a first period, and a second refresh enable signal having a second period, wherein the second period is longer than the first period;
first control circuitry configured to assert a first control signal to indicate that a differential-cell standby mode is being entered;
decoder circuitry configured to convert data stored in the array of memory cells from a single-cell mode to a differential-cell mode when the first control signal is asserted;
second control circuitry configured to assert a second control signal to indicate that the data stored in the array of memory cells has been converted from a single-cell mode to a differential-cell mode;

a selection circuit configured to use the first refresh enable signal to control refresh operations when data is stored in the array of memory cells in the single-cell mode, and configured to use the second refresh enable signal to control refresh operations when data is stored in the array of memory cells in the differential-cell mode, wherein the selection circuit is controlled by the second control signal.

* * * * *